US009020990B2

(12) United States Patent
Brockway et al.

(10) Patent No.: US 9,020,990 B2
(45) Date of Patent: Apr. 28, 2015

(54) STORED DATA REVERIFICATION MANAGEMENT SYSTEM AND METHOD

(75) Inventors: Brian Brockway, Shrewsbury, NJ (US); Parag Gokhale, Ocean, NJ (US); Jun Lu, Ocean, NJ (US)

(73) Assignee: CommVault Systems, Inc., Tinton Falls, NJ (US)

( * ) Notice: Subject to any disclaimer, the term of this patent is extended or adjusted under 35 U.S.C. 154(b) by 0 days.

(21) Appl. No.: 13/615,138

(22) Filed: Sep. 13, 2012

(65) Prior Publication Data
US 2013/0006927 A1 Jan. 3, 2013

Related U.S. Application Data

(63) Continuation of application No. 12/610,673, filed on Nov. 2, 2009, now Pat. No. 8,346,825, which is a continuation of application No. 11/313,226, filed on Dec. 19, 2005, now Pat. No. 7,613,748, which is a continuation-in-part of application No. 10/990,286, filed on Nov. 15, 2004, now Pat. No. 7,440,982.

(60) Provisional application No. 60/520,452, filed on Nov. 13, 2003.

(51) Int. Cl.
*G06F 12/00* (2006.01)
*G06F 17/30* (2006.01)
*G06F 11/14* (2006.01)

(52) U.S. Cl.
CPC ..... *G06F 17/30309* (2013.01); *Y10S 707/99955* (2013.01); *G06F 11/1448* (2013.01)

(58) Field of Classification Search
CPC .............. G06F 17/30; G06F 17/30174; G06F 17/30575; G06F 17/30581; G06F 17/30578
USPC .......................................... 707/823, 822, 821
See application file for complete search history.

(56) References Cited

U.S. PATENT DOCUMENTS 4,296,465 A   10/1981   Lemak
4,586,182 A   4/1986   Gallager
(Continued)

FOREIGN PATENT DOCUMENTS

EP   0259912   3/1988
EP   0405926   1/1991
(Continued)

OTHER PUBLICATIONS

Armstead et al., "Implementation of a Campus-Wide Distributed Mass Storage Service: The Dream vs. Reality," IEEE, 1995, pp. 190-199.
(Continued)

*Primary Examiner* — Debbie Le
*Assistant Examiner* — Thomas Meng
(74) *Attorney, Agent, or Firm* — Knobbe, Martens, Olson & Bear, LLP

(57) ABSTRACT

A system and method are provided for verifying data copies and reverifying the copies over the life span of media according to a verification policy. Characteristics of media and use of media are tracked to provide metrics which may be used to dynamically reevaluate and reassign verification policies to optimize media usage. Copies that fail verification operations may be repaired by repeating a storage operation for recent copies or by substituting a close temporal copy of the failed copy.

16 Claims, 15 Drawing Sheets

(56) References Cited

U.S. PATENT DOCUMENTS

| | | |
|---|---|---|
| 4,686,620 A | 8/1987 | Ng |
| 4,995,035 A | 2/1991 | Cole et al. |
| 5,005,122 A | 4/1991 | Griffin et al. |
| 5,093,912 A | 3/1992 | Dong et al. |
| 5,133,065 A | 7/1992 | Cheffetz et al. |
| 5,193,154 A | 3/1993 | Kitajima et al. |
| 5,212,772 A | 5/1993 | Masters |
| 5,226,157 A | 7/1993 | Nakano et al. |
| 5,239,647 A | 8/1993 | Anglin et al. |
| 5,241,668 A | 8/1993 | Eastridge et al. |
| 5,241,670 A | 8/1993 | Eastridge et al. |
| 5,245,595 A | 9/1993 | Yasukawa |
| 5,276,860 A | 1/1994 | Fortier et al. |
| 5,276,867 A | 1/1994 | Kenley et al. |
| 5,287,500 A | 2/1994 | Stoppani, Jr. |
| 5,301,351 A | 4/1994 | Jippo |
| 5,311,509 A | 5/1994 | Heddes et al. |
| 5,321,816 A | 6/1994 | Rogan et al. |
| 5,333,315 A | 7/1994 | Saether et al. |
| 5,347,653 A | 9/1994 | Flynn et al. |
| 5,410,700 A | 4/1995 | Fecteau et al. |
| 5,448,724 A | 9/1995 | Hayashi |
| 5,485,606 A | 1/1996 | Midgdey et al. |
| 5,491,810 A | 2/1996 | Allen |
| 5,495,607 A | 2/1996 | Pisello et al. |
| 5,504,873 A | 4/1996 | Martin et al. |
| 5,544,345 A | 8/1996 | Carpenter et al. |
| 5,544,347 A | 8/1996 | Yanai et al. |
| 5,546,574 A | 8/1996 | Grosskopf et al. |
| 5,559,957 A | 9/1996 | Balk |
| 5,559,991 A | 9/1996 | Kanfi |
| 5,592,618 A | 1/1997 | Micka et al. |
| 5,598,546 A | 1/1997 | Blomgren |
| 5,615,392 A | 3/1997 | Harrison et al. |
| 5,619,644 A | 4/1997 | Crockett et al. |
| 5,638,509 A | 6/1997 | Dunphy et al. |
| 5,642,496 A | 6/1997 | Kanfi |
| 5,673,381 A | 9/1997 | Huai et al. |
| 5,675,511 A | 10/1997 | Prasad et al. |
| 5,682,513 A | 10/1997 | Candelaria et al. |
| 5,687,343 A | 11/1997 | Fecteau et al. |
| 5,699,361 A | 12/1997 | Ding et al. |
| 5,719,786 A | 2/1998 | Nelson et al. |
| 5,729,743 A | 3/1998 | Squibb |
| 5,737,747 A | 4/1998 | Vishlitsky et al. |
| 5,751,997 A | 5/1998 | Kullick et al. |
| 5,758,359 A | 5/1998 | Saxon |
| 5,761,677 A | 6/1998 | Senator et al. |
| 5,761,734 A | 6/1998 | Pfeffer et al. |
| 5,764,972 A | 6/1998 | Crouse et al. |
| 5,765,172 A | 6/1998 | Fox |
| 5,778,395 A | 7/1998 | Whiting et al. |
| 5,790,828 A | 8/1998 | Jost |
| 5,805,920 A | 9/1998 | Sprenkle et al. |
| 5,812,398 A | 9/1998 | Nielsen |
| 5,813,009 A | 9/1998 | Johnson et al. |
| 5,813,017 A | 9/1998 | Morris |
| 5,829,046 A | 10/1998 | Tzelnic et al. |
| 5,860,104 A | 1/1999 | Witt et al. |
| 5,875,478 A | 2/1999 | Blumenau |
| 5,887,134 A | 3/1999 | Ebrahim |
| 5,901,327 A | 5/1999 | Ofek |
| 5,924,102 A | 7/1999 | Perks |
| 5,933,104 A | 8/1999 | Kimura |
| 5,950,205 A | 9/1999 | Aviani, Jr. |
| 5,956,519 A | 9/1999 | Wise et al. |
| 5,970,233 A | 10/1999 | Liu et al. |
| 5,970,255 A | 10/1999 | Tran et al. |
| 5,974,563 A | 10/1999 | Beeler, Jr. |
| 5,987,478 A | 11/1999 | See et al. |
| 5,995,091 A | 11/1999 | Near et al. |
| 6,003,089 A | 12/1999 | Shaffer et al. |
| 6,009,274 A | 12/1999 | Fletcher et al. |
| 6,012,090 A | 1/2000 | Chung et al. |
| 6,021,415 A | 2/2000 | Cannon et al. |
| 6,026,414 A | 2/2000 | Anglin |
| 6,052,735 A | 4/2000 | Ulrich et al. |
| 6,073,220 A | 6/2000 | Gunderson |
| 6,076,148 A | 6/2000 | Kedem et al. |
| 6,094,416 A | 7/2000 | Ying |
| 6,094,684 A | 7/2000 | Pallmann |
| 6,105,129 A | 8/2000 | Meier et al. |
| 6,122,668 A | 9/2000 | Teng et al. |
| 6,131,095 A | 10/2000 | Low et al. |
| 6,131,190 A | 10/2000 | Sidwell |
| 6,148,412 A | 11/2000 | Cannon et al. |
| 6,154,787 A | 11/2000 | Urevig et al. |
| 6,154,852 A | 11/2000 | Amundson et al. |
| 6,161,111 A | 12/2000 | Mutalik et al. |
| 6,167,402 A | 12/2000 | Yeager |
| 6,202,085 B1 | 3/2001 | Benson et al. |
| 6,212,512 B1 | 4/2001 | Barney et al. |
| 6,237,059 B1 | 5/2001 | Dean et al. |
| 6,260,069 B1 | 7/2001 | Anglin |
| 6,269,431 B1 | 7/2001 | Dunham |
| 6,275,953 B1 | 8/2001 | Vahalia et al. |
| 6,292,783 B1 | 9/2001 | Rohler |
| 6,301,592 B1 | 10/2001 | Aoyama et al. |
| 6,324,581 B1 | 11/2001 | Xu et al. |
| 6,328,766 B1 | 12/2001 | Long |
| 6,330,570 B1 | 12/2001 | Crighton et al. |
| 6,330,642 B1 | 12/2001 | Carteau |
| 6,343,324 B1 | 1/2002 | Hubis et al. |
| RE37,601 E | 3/2002 | Eastridge et al. |
| 6,353,818 B1 | 3/2002 | Carino, Jr. |
| 6,356,801 B1 | 3/2002 | Goodman et al. |
| 6,374,336 B1 | 4/2002 | Peters et al. |
| 6,381,740 B1 | 4/2002 | Miller et al. |
| 6,389,432 B1 | 5/2002 | Pothapragada et al. |
| 6,389,511 B1 | 5/2002 | Kedem |
| 6,418,478 B1 | 7/2002 | Ignatius et al. |
| 6,421,711 B1 | 7/2002 | Blumenau et al. |
| 6,467,035 B2 | 10/2002 | Tate et al. |
| 6,484,232 B2 | 11/2002 | Olarig et al. |
| 6,487,561 B1 | 11/2002 | Ofek et al. |
| 6,487,644 B1 | 11/2002 | Huebsch et al. |
| 6,502,205 B1 | 12/2002 | Yanai et al. |
| 6,519,679 B2 | 2/2003 | Devireddy et al. |
| 6,538,669 B1 | 3/2003 | Lagueux, Jr. et al. |
| 6,542,909 B1 | 4/2003 | Tamer et al. |
| 6,542,972 B2 | 4/2003 | Ignatius et al. |
| 6,564,228 B1 | 5/2003 | O'Connor |
| 6,581,143 B2 | 6/2003 | Gagne et al. |
| 6,604,149 B1 | 8/2003 | Deo et al. |
| 6,654,825 B2 | 11/2003 | Clapp et al. |
| 6,658,436 B2 | 12/2003 | Oshinsky et al. |
| 6,658,526 B2 | 12/2003 | Nguyen et al. |
| 6,675,159 B1 | 1/2004 | Lin et al. |
| 6,704,755 B2 | 3/2004 | Midgley et al. |
| 6,732,124 B1 | 5/2004 | Koseki et al. |
| 6,760,723 B2 | 7/2004 | Oshinsky et al. |
| 6,871,160 B2 | 3/2005 | Jaw |
| 6,886,020 B1 | 4/2005 | Zahavi et al. |
| 7,003,641 B2 | 2/2006 | Prahlad et al. |
| 7,007,046 B2 | 2/2006 | Manley et al. |
| 7,035,880 B1 | 4/2006 | Crescenti et al. |
| 7,130,970 B2 | 10/2006 | Devassy et al. |
| 7,174,433 B2 | 2/2007 | Kottomtharayil et al. |
| 7,213,021 B2 | 5/2007 | Taguchi et |
| 7,246,207 B2 | 7/2007 | Kottomtharayil et al. |
| 7,272,606 B2 | 9/2007 | Borthakur et al. |
| 7,315,923 B2 | 1/2008 | Retnamma et al. |
| 7,346,623 B2 | 3/2008 | Prahlad et al. |
| 7,380,072 B2 | 5/2008 | Kottomtharayil et al. |
| 7,409,509 B2 | 8/2008 | Devassy et al. |
| 7,421,439 B2 | 9/2008 | Wang et al. |
| 7,440,982 B2 | 10/2008 | Lu et al. |
| 7,472,238 B1 | 12/2008 | Gokhale |
| 7,484,054 B2 | 1/2009 | Kottomtharayil et al. |
| 7,490,207 B2 | 2/2009 | Amarendran et al. |
| 7,500,053 B1 | 3/2009 | Kavuri et al. |
| 7,536,291 B1 | 5/2009 | Retnamma et al. |
| 7,546,324 B2 | 6/2009 | Prahlad et al. |
| 7,613,748 B2 | 11/2009 | Brockway et al. |

(56) References Cited

U.S. PATENT DOCUMENTS

| | | | |
|---|---|---|---|
| 7,765,369 | B1 | 7/2010 | Prahlad et al. |
| 7,865,470 | B2 | 1/2011 | Fires et al. |
| 8,156,086 | B2 | 4/2012 | Lu et al. |
| 8,346,825 | B2 | 1/2013 | Brockway et al. |
| 2002/0004883 | A1 | 1/2002 | Nguyen et al. |
| 2002/0042869 | A1 | 4/2002 | Tate et al. |
| 2003/0126107 | A1 | 7/2003 | Yamagami |
| 2003/0182330 | A1 | 9/2003 | Manley et al. |
| 2003/0182350 | A1* | 9/2003 | Dewey ................... 709/100 |
| 2004/0039912 | A1 | 2/2004 | Borrowman et al. |
| 2004/0054854 | A1 | 3/2004 | Thiyagaranjan et al. |
| 2004/0093325 | A1 | 5/2004 | Banerjee et al. |
| 2004/0193827 | A1 | 9/2004 | Mogi et al. |
| 2004/0230863 | A1 | 11/2004 | Buchhorn |
| 2005/0033800 | A1 | 2/2005 | Kavuri et al. |
| 2005/0044114 | A1 | 2/2005 | Kottomtharayil et al. |
| 2005/0050070 | A1 | 3/2005 | Sheldon |
| 2005/0114406 | A1 | 5/2005 | Borthakur et al. |
| 2005/0203910 | A1 | 9/2005 | Taguchi et al. |
| 2005/0246376 | A1 | 11/2005 | Lu et al. |
| 2005/0246510 | A1 | 11/2005 | Retnamma et al. |
| 2006/0053304 | A1 | 3/2006 | Fries et al. |
| 2006/0242489 | A1 | 10/2006 | Brockway et al. |
| 2009/0043830 | A1 | 2/2009 | Lu et al. |
| 2010/0100528 | A1 | 4/2010 | Brockway et al. |

FOREIGN PATENT DOCUMENTS

| | | |
|---|---|---|
| EP | 0467546 | 1/1992 |
| EP | 0774715 | 5/1997 |
| EP | 0809184 | 11/1997 |
| EP | 0862304 | 9/1998 |
| EP | 0899662 | 3/1999 |
| EP | 0981090 | 2/2000 |
| EP | 1174795 | 1/2002 |
| WO | WO 98/39707 | 9/1998 |
| WO | WO 99/14692 | 3/1999 |
| WO | WO 2005/055093 | 6/2005 |

OTHER PUBLICATIONS

Arneson, "Development of Omniserver; Mass Storage Systems," Control Data Corporation, 1990, pp. 88-93.

Arneson, "Mass Storage Archiving in Network Environments," Digest of Papers, Ninth IEEE Symposium on Mass Storage Systems, Oct. 31, 1988-Nov. 3, 1988, pp. 45-50, Monterey, CA.

Blanton, Microsoft (R) Computer Dictionary, Jan. 1, 2002, Microsoft Press, Fifth Edition, 97.

Cabrera, et al. "ADSM: A Multi-Platform, Scalable, Back-up and Archive Mass Storage System," Digest of Papers, Compcon '95, Proceedings of the 40th IEEE Computer Society International Conference, Mar. 5, 1995-Mar. 9, 1995, pp. 420-427, San Francisco, CA.

Eitel, "Backup and Storage Management in Distributed Heterogeneous Environments," IEEE, 1994, pp. 124-126.

Gait, "The Optical File Cabinet: A Random-Access File system for Write-Once Optical Disks," IEEE Computer, vol. 21, No. 6, pp. 11-22 (1988).

Jander, "Launching Storage-Area Net," Data Communications, US, McGraw Hill, NY, vol. 27, No. 4(Mar. 21, 1998), pp. 64-72.

Rosenblum et al., "The Design and Implementation of a Log-Structure File System," Operating Systems Review SIGOPS, vol. 25, No. 5, New York, US, pp. 1-15 (May 1991).

Stevens, TCP/IP Illustrated, Dec. 31, 1993, Addison Wesley Professional, vol. 1: The Protocols, Chapter 17.3 TCP Header.

* cited by examiner

STORED DATA VERIFICATION TABLE — 600

| CHUNK ID (610) | CHUNK VERIFIED (620) | RESULT (630) |
|---|---|---|
| 1 | YES/NO | GOOD COPY |
| 2 | YES/NO | UNSUCCESSFUL |
| 3 | YES/NO | GOOD COPY |
| 4 | YES/NO | FILE 5 BAD |
| 5 | YES/NO | BAD INCREMENTAL BLOCK |
| 6 | YES/NO | GOOD COPY |
| 7 | YES/NO | GOOD COPY |
| 8 | YES/NO | GOOD COPY |
| 9 | YES/NO | FILE 10 BAD |
| n | YES/NO | BAD INCREMENTAL BLOCK |

FIG. 7

| ID | Verific. Pol | Last Ver. On | # of Vers. | Reverification Status | Criteria | Last Ver. Op. Result | Expected Fail |
|---|---|---|---|---|---|---|---|
| Job 85780 | 2 Years | 11/16/2003 | 1 | Overdue | ABCSD, Full Copies | Success | 2.5 Years |
| Arch File 451 | 6 Months | 06/30/2005 | 8 | Due in 11 days | All bytes used, trading data | Fail | 10 Months |
| Media 53156 | 1 Year | 02/15/2005 | 2 | Due 2+ months | Daily copies, Oracle | | 0.95 Years |
| 9592668 | 1.5 Years | | 0 | ASAP or due in 1.5 Yr | SL2 Weekly copies, MSExch | | |

Verification Table – 12/19/2005

FIG. 10

| Media ID | Verification Policy | MEDIA VERIFICATION/FAILURE/SUCCESS | | |
|---|---|---|---|---|
| | | Outcome | Characteristics | |
| 52480928 | 2 Years | File 9 fail | SD 1, hourly copy, NY financial trades |
| 23580033 | 6 Months | Success | SD 4, biweekly copy, NJ word docs |
| 93857629 | 1 Year | Success | SD 3, daily copy, user email |
| 60983255 | 3 Years | Failure | SD N, monthly copy, files |

STORED DATA REVERIFICATION MANAGEMENT SYSTEM AND METHOD

RELATED APPLICATIONS

This application is a continuation of U.S. patent application Ser. No. 12/610,673, filed Nov. 2, 2009, which is a continuation of U.S. patent application Ser. No. 11/313,226, filed Dec. 19, 2005, which is a continuation-in-part of U.S. patent application Ser. No. 10/990,286, filed Nov. 15, 2004, titled SYSTEM AND METHOD FOR STORED DATA ARCHIVE VERIFICATION, now U.S. Pat. No. 7,440,982, issued Oct. 21, 2008, which claims priority to U.S. Provisional Patent Application No. 60/520,452, filed Nov. 13, 2003, titled SYSTEM AND METHOD FOR STORED DATA ARCHIVE VERIFICATION, each of which is hereby incorporated herein by reference in its entirety.

This application is also related to the following applications, each of which is hereby incorporated herein by reference in its entirety:

- U.S. Pat. No. 6,418,478, titled PIPELINED HIGH SPEED DATA TRANSFER MECHANISM, issued Jul. 9, 2002;
- U.S. Provisional Patent Application No. 60/460,234, titled SYSTEM AND METHOD FOR PERFORMING STORAGE OPERATIONS IN A COMPUTER NETWORK, filed Apr. 30, 2003;
- U.S. Pat. No. 7,246,207, titled SYSTEM AND METHOD FOR DYNAMICALLY PERFORMING STORAGE OPERATIONS IN A COMPUTER NETWORK, issued Jul. 17, 2007;
- U.S. Pat. No. 7,107,298, titled SYSTEM AND METHOD FOR ARCHIVING OBJECTS IN AN INFORMATION STORE, issued Sep. 12, 2006; and
- U.S. Pat. No. 7,209,972, titled HIGH SPEED DATA TRANSFER MECHANISM, issued Apr. 24, 2007.

COPYRIGHT NOTICE

A portion of the disclosure of this patent document contains material which is subject to copyright protection. The copyright owner has no objection to the facsimile reproduction by anyone of the patent document or the patent disclosures, as it appears in the Patent and Trademark Office patent files or records, but otherwise reserves all copyright rights whatsoever.

BACKGROUND

1. Field of the Invention

The invention disclosed herein relates generally to data storage systems in computer networks and, more particularly, to improvements in storing, verifying accurate archiving of electronic data and continuing reverification archives of electronic data.

2. Description of the Related Art

Storage architectures used by individual computers or data stores to store electronic data typically include volatile storage media such as Random Access Memory "RAM", and one or more nonvolatile storage devices such as hard drives, tape drives, optical disks, and other storage devices that form a part of or are directly associated with an individual computer. Such storage devices may provide primary storage for a primary copy of data.

A network of computers such as a Local Area Network "LAN" or a Wide Area Network "WAN", typically store electronic data via servers or storage devices accessible via the network. Storage devices are generally connected to one individual computer or to a network of computers. Network storage devices commonly known in the art typically include physical drives in which tapes or other storage media are stored and a robotic arm which is used to place the tapes or storage media into the drives. Examples of network storage devices include networkable tape libraries, optical libraries, Redundant Arrays of Inexpensive Disks "RAID", and other devices. Another network storage device may be Network Attached Storage "NAS" which includes storage devices that may provide file services and one or more devices on which data is stored.

The first copy of production data generated by a client is sometimes referred to as the primary copy, and is used in the first instance to restore the production data in the event of a disaster or other loss or corruption of the production data. Under traditional tiered storage, the data on the primary storage device is migrated to other devices, sometimes referred to as secondary or auxiliary storage devices. This migration can occur after a certain amount of time from which the data is first stored on the primary device, or for certain types of data as selected in accordance with a user-defined policy. Usually, with tiered storage patterns, the storage devices used to store auxiliary or secondary copies of data have less availability, lower performance, and/or fewer resources than devices storing the production or primary copies. That is, primary storage devices tend be faster, higher capacity and more readily available devices, such as magnetic hard drives, than the ones used for storing auxiliary copies, such as magnetic or optical disks or other removable media storage devices.

Electronic data is typically copied to secondary storage according to a schedule, for example, data is designated to be copied and stored once a day. Generally, data is archived in the event that a primary or original copy becomes unavailable, for example, the data is destroyed, lost or otherwise inaccessible. In general, the data is directed to a system component to be copied to secondary storage media, and stored as an auxiliary copy, a backup copy, quick recovery copy, or other copy. Some systems check the secondary copy to ensure the secondary copy is accurate. Generally, the check includes steps such as analyzing each data item copied and comparing it to the original data, fingerprint, hash, or other segment of data, or other method. Such verification methods can be lengthy and time consuming for copies of large volumes of data, requiring significant use of system resources. Alternatively, some systems use cursory data checks when a secondary copy is made, such as only comparing filenames copied to secondary storage with file names from primary storage, which is less time consuming, but also yield a less reliable data check.

Data copies stored to media may have a shelf life which may be based on media life expectancy. To maintain a reliable set of copies, a subsequent data copy (such as a copy of a copy) may be made before the end of a media item's life expectancy. A media manufacturer may provide an indication of a media item's life expectancy; however, the life expectancy may not take into account user or enterprise use of the media or other media characteristics. Thus, in use, media may actually have a shorter or longer life than its life expectancy because of media use, other media characteristics, or other external factors. Since media may be costly, a user or enterprise may wish to maximize media life and use of media while avoiding media failure.

SUMMARY

Systems and methods are provided herein for reverifying electronic data. In one embodiment of the invention, a method for reverifying data is provided, including: in accordance with a verification policy, identifying a media item and initiating a verification operation; and in association with an outcome of the verification operation, tracking at least one storage characteristic of the media item. The outcome of the verification operation and the at least one storage characteristic are tracked to generate a metric, wherein the metric is applied to evaluate the verification policy. The metric is applied to evaluate the verification policy comprises predicting media use to perform a storage operation according to a storage policy. If the verification operation outcome fails; further comprising identifying the at least one characteristic of the media item; identifying a second media item including the at least one characteristic; and evaluating the verification policy of the second media item In another embodiment, a method for repairing reverified data is provided, including: initiating a verification operation for a data copy, according to a verification policy; if the data copy fails the verification operation, repairing the data copy, wherein repairing the data copy comprises identifying a close temporal copy, and updating the data copy with the close temporal copy. The close temporal copy is identified by consulting an index. Alternatively, the close temporal copy is a copy of data that is the same application type as the data copy, from a time period similar to the data copy, or identified according to user preferences.

In another embodiment, a method for forecasting media usage is provided including: receiving at least one storage characteristic of a first media item among a plurality of media items; receiving a verification policy for the first media item; initiating a verification operation for the first media item according to the verification policy; tracking an outcome of the verification operation; calculating a metric based on the outcome and the at least one storage characteristic; and based on the metric, evaluating the verification policy. Evaluating the verification policy comprises identifying a second media item among the plurality of media items having the at least one storage characteristic; and dependent on the outcome of the verification operation of the first media item, evaluating the verification policy of the second media item.

BRIEF DESCRIPTION OF THE DRAWINGS

The invention is illustrated in the figures of the accompanying drawings which are meant to be exemplary and not limiting, in which like references are intended to refer to like or corresponding parts, and in which:

FIG. 7 is a block diagram showing a stored data verification table according to an embodiment of the invention;

FIG. 10 is a verification table, according to an embodiment of the invention;

FIG. 13 is a verification outcome table, according to an embodiment of the invention;

DETAILED DESCRIPTION OF THE PREFERRED EMBODIMENTS

Figure 1:
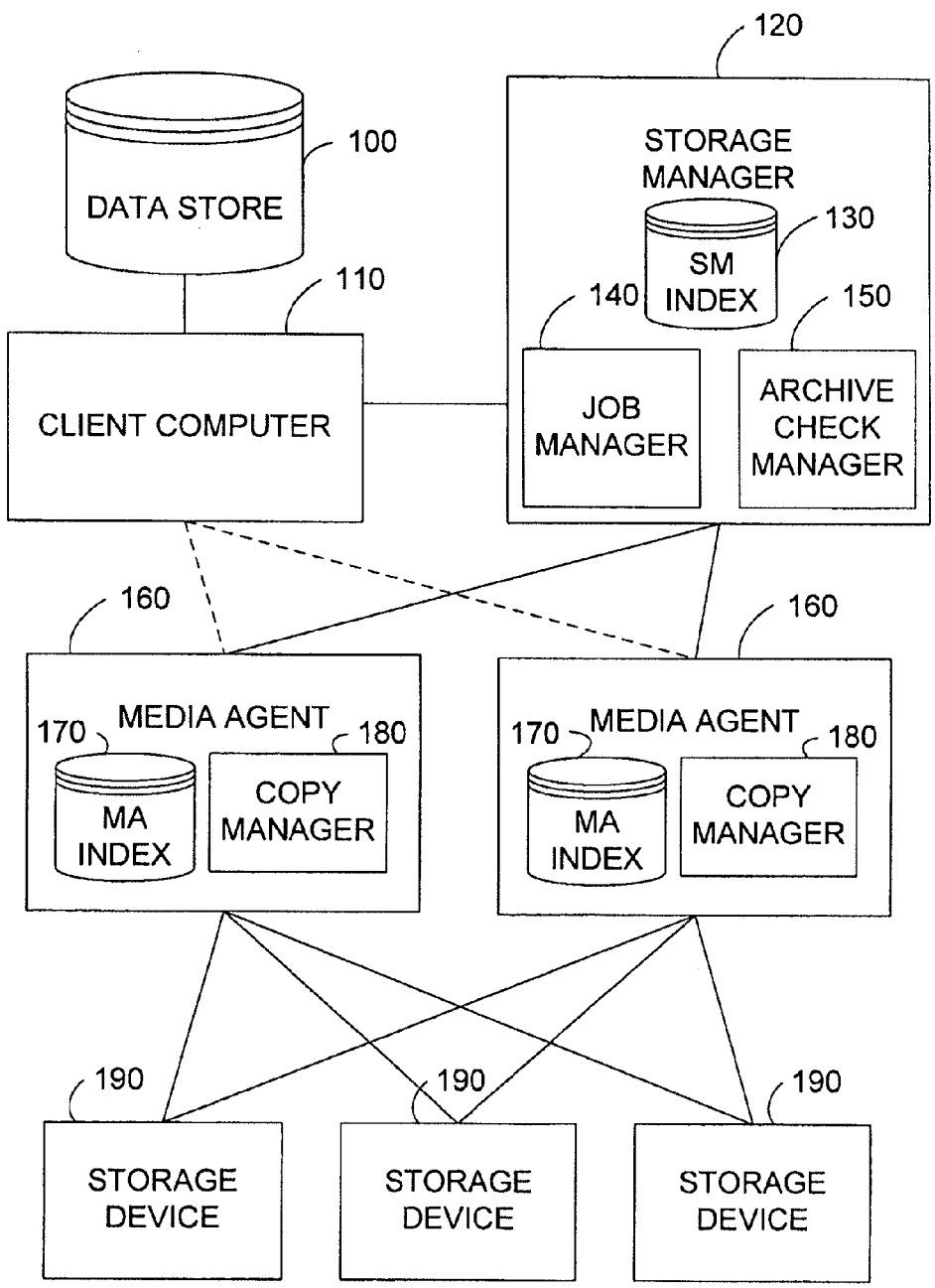
FIG. 1 is block diagram showing a high-level view of the storage network architecture and components according to an embodiment of the invention.

Preferred embodiments of the invention are now described with reference to FIGS. 1-15. An embodiment of the system of the present invention is shown in FIG. 1. The system and components of the system as presented in FIG. 1 are exemplary of a modular storage system such as the CommVault GALAXY storage management and retrieval system and QINETIX storage management system, available from CommVault Systems, Inc., of Oceanport, N.J., and further described in U.S. Provisional Patent Application No. 60/460, 234, titled SYSTEM AND METHOD FOR PERFORMING STORAGE OPERATIONS IN A COMPUTER NETWORK, filed Apr. 3, 2003, which is incorporated herein by reference in its entirety.

As shown in FIG. 1, the system includes a data store 100 communicatively coupled to a client computer 110, a storage manager (or storage manager component) 120, storage manager index ("SM index") 130, a job manager 140, an archive check manager 150, one or more media agents (or media management components) 160, an MA index 170, a copy manager 180, and one or more storage devices 190. The data store 100 contains data generated by a typical computing device, such as client computer 110. For example, a data store 100 may contain Oracle database data or mail server data. In the event that a data store 100 loses data, the data store 100 obtains the lost data from a secondary copy such as a backup copy which may be stored in secondary storage, for example in a storage device 190.

The client computer 110 may be a single client computer 110 or a plurality of client computers 110. Client computer 110 generally refers to a computer, such as a personal computer, a workstation, a server computer, a host computer, etc., with data, e.g. a primary data set, which may be backed up, or otherwise copied to secondary storage. The client computer 110 typically also includes software to facilitate transfers of electronic information such as a client 110 data from client computer 110 to and from the data store 100 and to the other system components. The client computer 110 is generally in communication with the storage manager 120. In some embodiments of the invention, the client computer 110 is also in communication with one or more media agents 160.

The storage manager 120 is generally a software module or modules capable of coordinating and controlling a storage system. The storage manager 120 may contain an SM index 130, a job manager 140, and an archive check manager 150. In other embodiments of the invention, the SM index 130, job manager 140, or archive check manager 150 may exist independently within the storage system, or reside within different components of the storage system, such as the media agent 160. The storage manager 120 may communicate directly with the client computer 110 and media agent 160 to initiate, perform and manage system storage operations. Storage operations include, but are not limited to, creation, storage, retrieval, migration, deletion, access, and tracking of primary or production volume data, primary copies and secondary volume data including secondary copies, auxiliary copies, snapshot copies, backup copies, incremental copies, differential copies, HSM copies, archive copies, Information Lifecycle Management ("ILM") copies, and other types of copies and versions of electronic data. The storage manager 120 manages system storage operations, and together with the job manager 140 and archive check manager 150, manages and directs data verification, including, for example, updating the data verification information to SM index 130.

The storage manager 120 includes SM index 130, which is generally any storage index that is maintained to store index data for storage operations, such as data verification operations. Data stored to the SM index 130 in data verification operations includes for example, data copied to secondary storage, the metadata generated in association with data sets, such as archive files, data headers and footers, the results of verification checks, and other information generated by the system during storage operations. The SM index 130 can also be a storage index known in the art, or other storage index, such as, the index cache of CommVault's GALAXY as further described in U.S. Pat. No. 7,107,298, issued Sep. 12, 2006, which is incorporated herein by reference in its entirety. The SM index 130 stores data related to the storage system components, including information related to each data set, copies, backups, metadata, or other information. Index data is useful because, among other benefits, it provides the system with an efficient mechanism for locating information associated with performing storage operations.

The storage manager 120 also includes the job manager 140, which is a module (or modules) that generally schedules and monitors storage operations that are to be performed, are being performed, or have been completed by the system. The job manager 140 can schedule storage operations automatically, for example, based on storage policies or verification policies. Alternatively, storage operations can also be scheduled manually, for example, a user may enter an input to the job manager 140, using, for example, a user interface to schedule a storage operation. The job manager 140 directs the archive check manager 150 to initiate data verification operations, as further described herein. The job manager 140 is preferably included in the storage manager 120, but may exist independently in the system, or be associated with another system component, such as media agent 160 or client 110.

A storage policy is generally a data structure or other information which includes a set of preferences and other storage criteria for performing a storage operation. The preferences and storage criteria may include, but are not limited to: a storage location, relationships between system components, network pathway to utilize, retention policies, data characteristics, compression or encryption requirements, preferred system components to utilize in a storage operation, and other criteria relating to a storage operation. A storage policy may be stored to a storage manager index, to secondary storage or other archive media as metadata for use in restore operations or other storage operations, or to other locations or components of the system.

The archive check manager 150 is also included in the storage manager 120, and is a module (or modules) that generally manages data verification operations within the system, as further described herein. For example, the archive check manager 150 identifies data to be verified in data verification operations and generally manages the data verification operation. The archive check manager 150 is preferably included in the storage manager 120, but may exist independently in the system, or be associated with another system component, such as media agent 160 or client 110.

The media agent 160 is generally a module or modules capable of managing storage operations, such as copying and backups, or other storage-related operations. The media agent 160 preferably includes a media agent index ("MA index") 170 and copy manager 180. The media agent 160 is in communication with the storage manager 120 and storage device 190, for example, via a local connection or a network. The media agent 160 may also be in communication with the client computer 110. The media agent 160 is capable of communicating instructions from a storage manager 120 or clients 110 to undertake a storage operations transferring data to and from client computer 110 to and from storage devices 190.

Additionally, the media agent 160 is capable of directing the copy manager 180, which is responsible for initiating and performing a copy operation. The media agent 160 stores data related to storage operations and media, such as secondary copies, to MA index 170. Examples of data stored by the media agent 160 to the MA index 170 include metadata or other data associated with storage operations.

The MA index 170 may be an index, such as the media agent index described in U.S. Provisional Patent Application No. 60/460,234, titled SYSTEM AND METHOD FOR PERFORMING STORAGE OPERATIONS IN A COMPUTER NETWORK, filed Apr. 3, 2003, or other storage index known in the art. The copy manager 180 is a module or modules used to initiate, manage and perform copy operations or other copy operations. A copy operation is a storage operation that generally includes creating a secondary copy of production or primary storage data for storage. For example, copies may be made for disaster recovery purposes, etc. The copy manager 180 preferably resides within the media agent 160, but can also exist as an independent system component, or within another system component.

The storage device 190 is generally one or more devices as further described herein. The storage device 190 may be a magnetic media storage device, optical media storage device, tape library, or other storage device described herein capable of performing storage operations. Storage device 190 may include hardware and software components such as storage media, media slots, media drives, robotic arms, and other components known in the art and used in performing storage operations on electronic data.

Production or primary storage data generated by or otherwise used by the client computer 110, is typically stored in data store 100. A secondary copy of the data, for example, a backup copy or other copy, is made according to storage policies, as further described herein. When the primary data is copied, the secondary copy is generally transferred to the storage device 190 via media agent 160. When the storage operation occurs, the secondary copy may be checked to verify that the contents of the secondary copy are identical to the original primary data.

Figure 2:
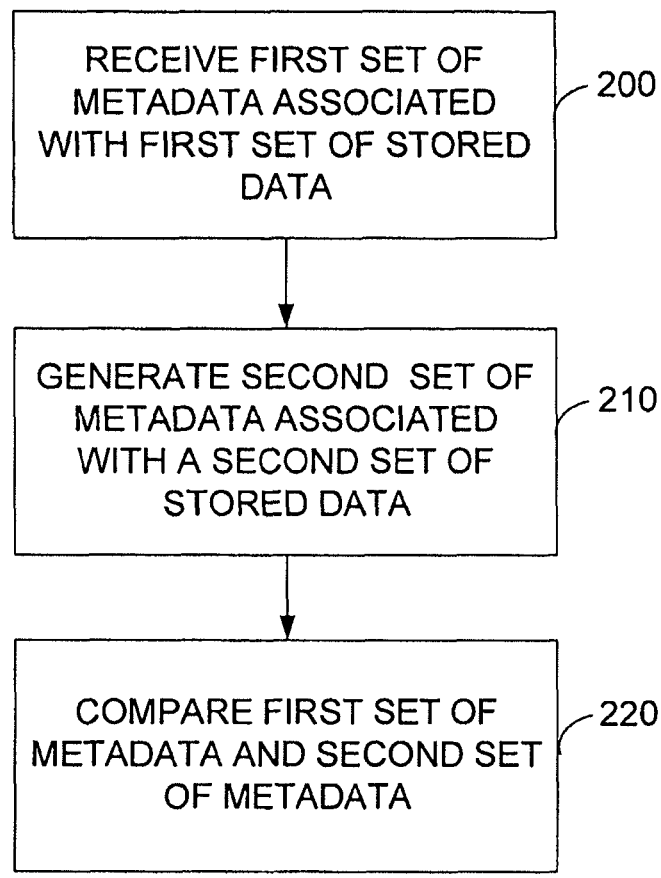
FIG. 2 is a flow diagram for verifying stored data according an embodiment of the invention.

Referring to FIG. 2, which depicts a flow chart of a method of an embodiment of the invention for verifying data, a first set of metadata associated with a first set of stored data may be received, step 200. Generally, when a copy of the original or first set of data is created, a set of metadata related to the first set of data is created. The metadata may be generated by the copy manager, or other system component, and may be received by a media agent, copy manager or other system component. The first set of metadata may be associated with a first set of stored data, for example, the first set of metadata is generated based on the first set of stored data. The first set of stored data may be an original set of data, primary copy, other original data copy or verified copy. The first set of metadata may be associated with the first set of stored data. For example, the first set of metadata can be generated according to a routine based on the first set of stored data, obtained using variables based on the first set of stored data, generated as a chunk header, as further described herein, or other procedure for obtaining metadata based on the first set of stored data, or other data. In preferred embodiments, the first set of metadata is stored to an index, such as the SM index or MA index.

A second set of metadata associated with a second set of stored data may be generated, step 210. The second set of stored data may be associated with the first set of stored data. For example, the second set of stored data may be a secondary storage copy of primary storage data, such as a backup, auxiliary copy or other secondary storage copy of the first set of stored data. The second set of metadata may be generated based on the second set of stored data. The procedure for generating the second set of metadata may be the same procedure used to generate the first set of metadata. The second set of metadata may be generated by a copy manager, a media agent, or other system component. Alternatively, the second set of metadata may be generated in a partial copy operation, wherein, a set of data is read, metadata based on the set of data is generated, but no copy of the data file is actually made. In another embodiment of the invention, the second set of metadata may be generated by the archive check manager. The second set of metadata may be stored to an index, such as the SM index or MA index.

The first set of metadata and the second set of metadata may be compared, step 220. The first set of metadata and the second set of metadata may be compared to determine whether the sets of metadata are similar, equivalent, or otherwise indicate that the underlying data which generated the metadata are substantially similar. If the comparison of the first set of metadata and the second set of metadata indicates that the sets of metadata are similar, the underlying data used to generate the first and second sets of metadata, in this case, the first and second sets of stored data, are substantially similar. Thus, the second set of stored data is determined to be an accurate or true copy of the first set of stored data. When the first set of metadata and the second set of metadata are determined to be different or inconsistent, or otherwise indicate that the underlying data used to generate the first and second sets of metadata are different, the first and second sets of stored data may not be equivalent, and therefore, the second set of stored data is likely an inaccurate or otherwise defective copy of the first set of stored data.

A copy manager may compare the first set of metadata and the second set of metadata. In another embodiment, an archive check manager compares the first set of metadata and the second set of metadata. The first set of metadata and the second set of metadata may be compared to determine whether the sets of metadata are the same. One or both of the sets of metadata may be obtained from an index, such as the MA index, SM index, or are generated as needed, for example, by performing a partial storage operation, further described herein, or other method for obtaining metadata.

Figure 3:
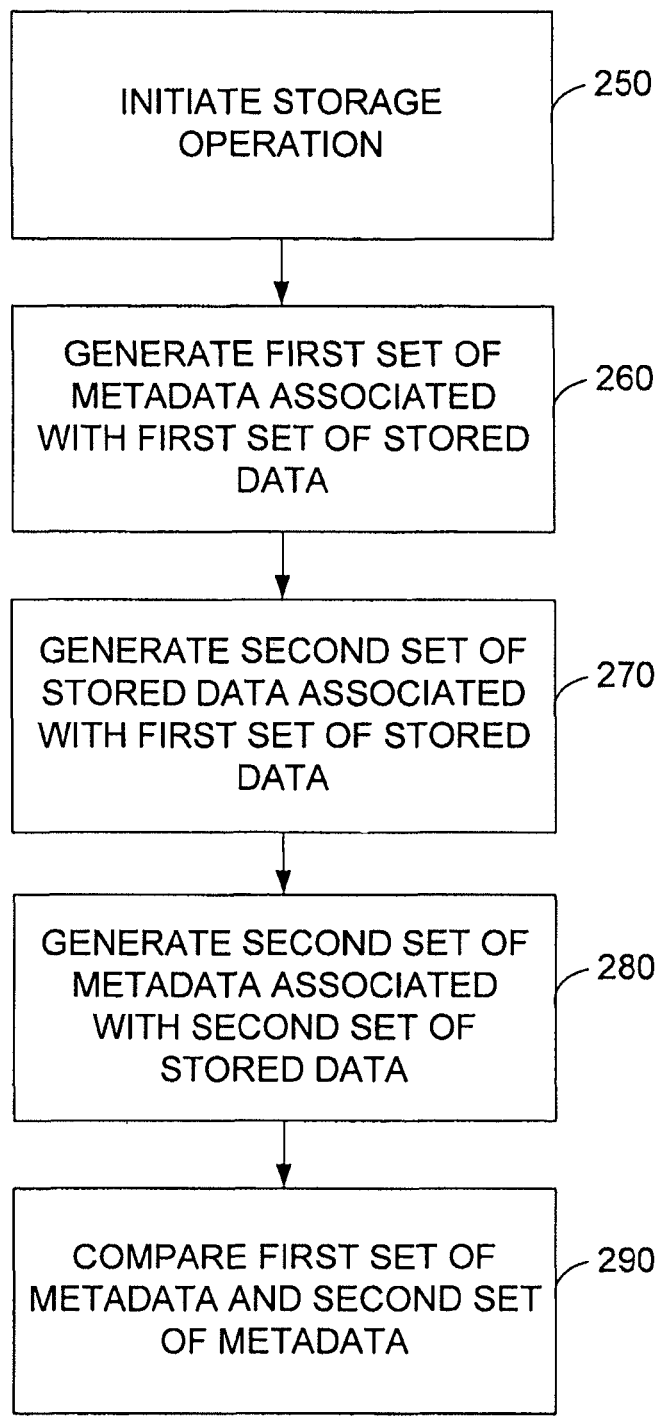
FIG. 3 is a flow diagram for verifying stored data according to an embodiment of the invention.

Referring to FIG. 3, which depicts a flowchart of another embodiment of the invention, a storage operation is initiated, step 250. The storage operation is normally initiated by a storage manager, for example, by a job manager, which, as described herein, schedules storage operations, for example, based on storage policies. Alternatively, other system components may initiate system storage operations. The job manager, or other system component, schedules storage operations and directs an archive check manager, or other system component, to initiate a storage operation. The storage operation initiated at step 250 may be an operation similar to a copy operation. For example, a data file in a client data store is copied. A copy manager, or other system component, generates a first set of metadata associated with a first set of stored data, step 260. For example, the copy manager initiates a copy operation, and obtains the first set of stored data. The copy manager reads the first set of stored data and generates a first set of metadata. As described herein, the first set of metadata is generated according to a procedure, such as according to a routine based on the first set of stored data, or obtained using a variable based on the first set of stored data, generated as a chunk header, or other procedure for obtaining metadata. The first set of stored data is generally an original set of data, such as production data, or alternatively, primary copy, other original copy or verified copy.

The copy manager or other system component may generate a second set of stored data associated with first set of stored data, step 270. The second set of stored data may be a backup, auxiliary copy, or other copy of the first set of stored data. The second set of stored data may be obtained by directing the copy manager to read the first set of stored data and write a copy, such as the second set of stored data, but may also be generated using other copy methods and system components. The copy manager, or other system component, generates a second set of metadata associated with the second set of stored data, step 280. Specifically, the second set of metadata may be generated based on the second set of stored data. The second set of metadata may be obtained using the same procedure used to generate the first set of metadata in step 260, or other procedure for generating metadata, for example, generating metadata based on data from a primary copy. The copy manager or other system component, compares the first set of metadata and the second set of metadata, step 290. The first set of metadata and the second set of metadata are compared to determine whether the first set of metadata and the second set of metadata are equivalent. As described herein, the comparison of the first and second sets of metadata may be used as an indicator of whether the second set of stored data is an accurate copy of the first set of stored data.

When data is copied, for example, when the media agent or copy manager copies a first set of stored data and creates a second set of stored data, the data is generally copied and transferred between system components using chunks, such as the system and methods described in U.S. Pat. No. 6,418,478, titled PIPELINED HIGH SPEED DATA TRANSFER MECHANISM, issued Jul. 9, 2002. Chunks are useful because they can be used to assemble data into packages that are transmitted across system networks, for example according to system resource availability.

Figure 4:
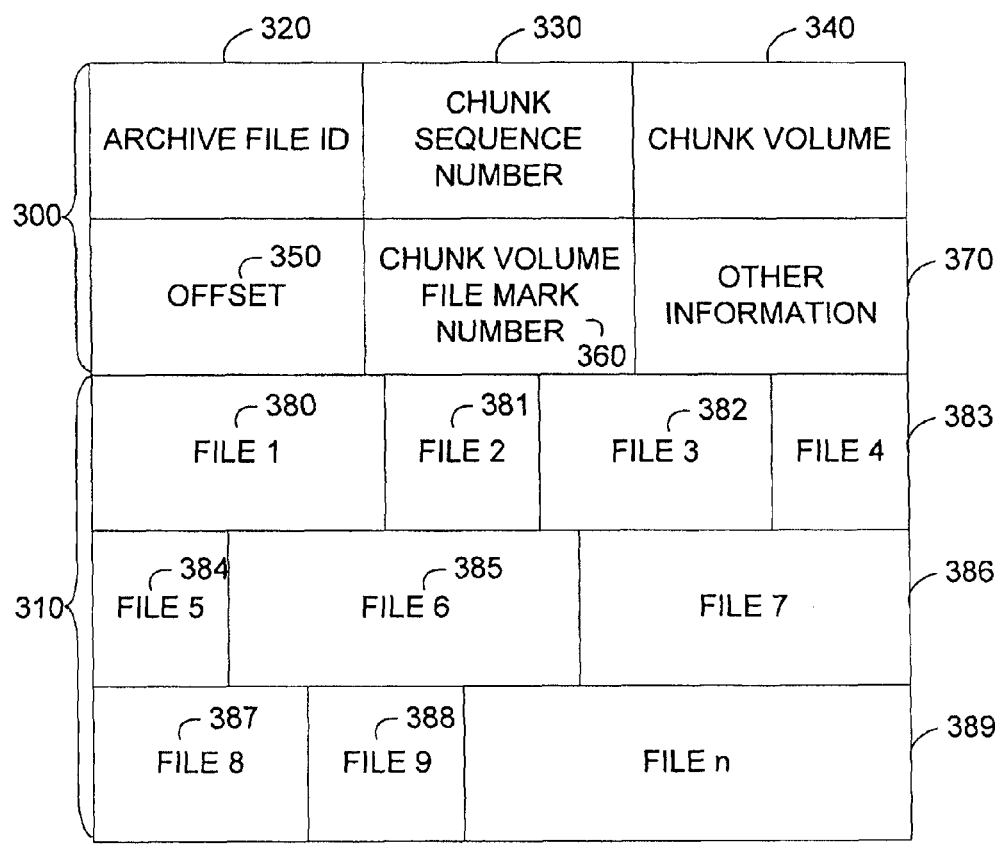
FIG. 4 is a block diagram showing a chunk, according to an embodiment of the invention.

Referring to FIG. 4, which depicts a chunk according to an embodiment of the invention, chunks are generally a fixed file size, such as 512 MB, and include a chunk header 300 and a chunk payload 310. The chunk header 300 includes data or information such as an archive file ID 320, a chunk sequence number 330, a chunk volume 340, an offset 350, a chunk volume file mark number 360, and other information 370. A chunk payload 310 includes data files or a subset of data files that were copied, e.g., an initial or first set of data. Each of the data items or information included in the chunk header 300 are related to the file data 380-389 in the chunk payload 310. The chunk header 300 data items include metadata generally derived from the stored data or files in the chunk payload 310.

For example, a copy manager or other system component which creates, packages, or otherwise handles chunks, reads the data contained in the chunk payload 310 to generate metadata or other information in the chunk header 300.

The archive file ID 320 is an alphanumeric identifier for the archive file being stored or copied. Files may be copied to an archive file and an archive file created with files and other electronic information from one or more chunks of data, e.g., data from payload 310. The chunk sequence number 330 provides the sequence information for the chunk. The chunk volume 340 indicates the volume of the chunk utilized, for example, the volume of the data or files on the chunk. Offset 350 indicates the distance the data items in the chunk are offset in the archive file, for example, which is information related to, and used in reassembling the chunk files to create an archive file. Chunk volume file mark number 360 refers to information related to the volume of the file. The chunk header 300 also contains other information 370, which may be data, variables, information or other metadata related to files 380-389 in the payload 310. Files 380-389 of the payload represent that a subset of a data file, a set of data, a file or a block, or several sets of data, files or blocks may be stored in a chunk payload, for example, file 1 to file n. The information contained in the chunk header 300 may be stored to an index, such as an MA index or SM index. Storing the information in the chunk header 300 to the index is useful so that the information can be readily accessed by a media agent, storage manager, copy manager or other system component.

Figure 5:
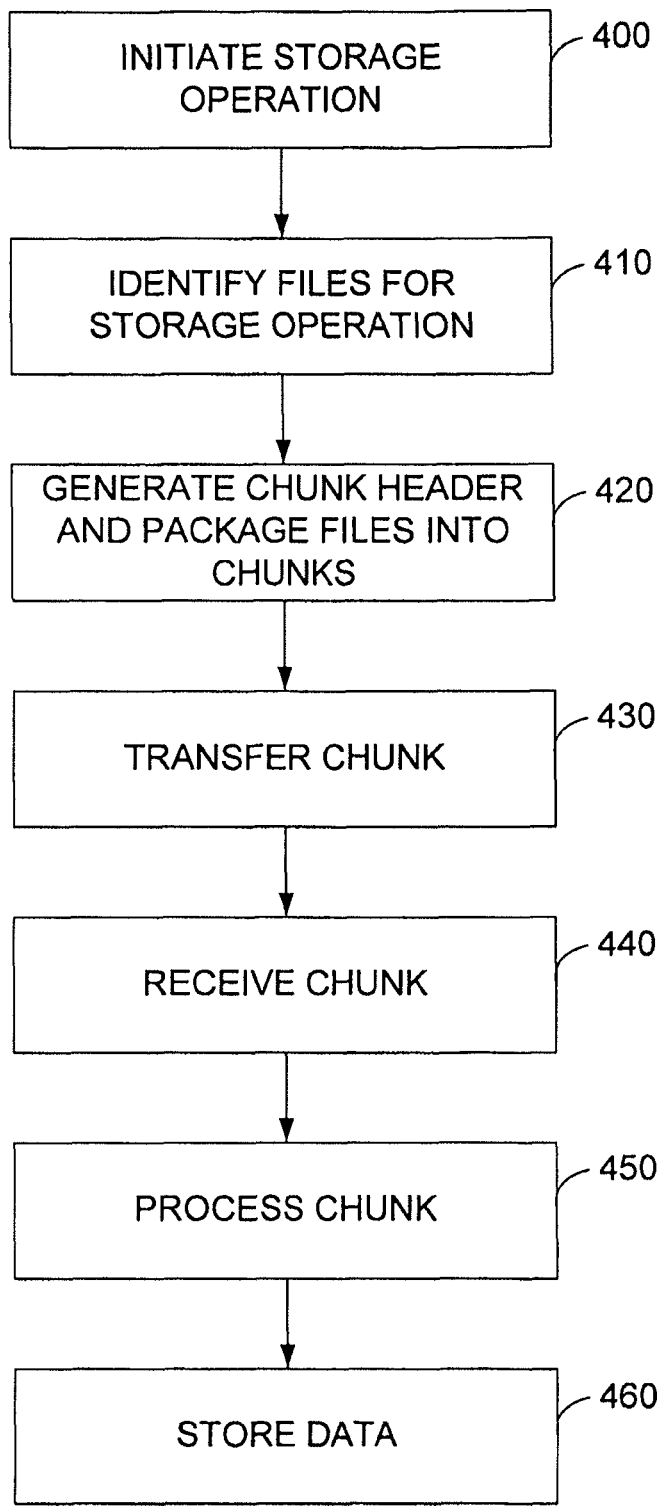
FIG. 5 is a flow diagram for a storage operation according to an embodiment of the invention.

Referring to FIG. 5, which depicts a flow diagram of a storage operation, a storage operation is initiated, step 400. Preferably the storage operation is initiated by a storage manager, or storage manager components, such as a job manager, an archive check manager, a media agent, or media agent components, such as a copy manager or other system component. The storage operations initiated at step 400 include, for example, system backups, media movement, imports, exports, migrations, restores, data verification and other storage-related operations. Files are identified for the storage operation, step 410. The files are identified by the media agent, storage manager, archive check manager, copy manager, or other system component. In some embodiments, the files may be identified according to storage policies associated with a particular file. As further described herein, information related to files and storage policies are stored in, and may be obtained from an index, such as an SM index or MA index, or other locations within the system.

In general, the storage operation is assigned to a particular media agent to manage the operation. The media agent may be associated with the file, storage device, or other system component utilized in the storage operation. Additionally, the media agent may be designated to manage the operation by storage policies. In some embodiments, the media agent may be dynamically reassigned during a storage operation according to storage policies, system resource availability or other variables. The copy manager used in storage operations is typically the copy manager associated with the media agent assigned to manage the operation. It is understood that the copy manager may be dynamically reassigned during the storage operation, for example, when its media agent is reassigned, or according to system resource availability or other variables.

A chunk header is generated for the files identified in step 410, and the files are packaged into chunks, step 420. The chunk header is generated according to a procedure, such as the procedure described herein in connection with generating metadata. For example, the chunk header is generated according to specific terms or variables based on the files, such as the data or information items included in the chunk header. Preferably, the copy manager creates the chunk header. The files are packaged into chunks, for example, into a payload. The chunk header information is updated to an index, such as an SM index or MA index.

The chunk is transferred, step 430, for example, via the networks using, or as directed by, a media agent, or other component. In general, the chunk is transferred through the networks according to system resource availability. The chunk transfer destination may be a storage device assigned according to storage policies, or as directed by media agent, storage manager, or other system component.

The chunk is received, step 440 at the storage device. The storage device may communicate data indicating that the chunk has been received to the media agent, storage manager or other system component. The chunk receipt data is updated to an index, such as the SM index or MA index. Upon receipt of the chunk, the chunk is processed, step 450. The chunk is generally processed by sequence number, or other information that is contained in the chunk header to reassemble the files, e.g., archive file, etc. The copy manager may read the chunk header and store the data contained in the chunk header to an index, such as the SM index or MA index. In some embodiments, the data or files contained in the chunk payload are extracted from the chunk according to the chunk header information. The copy manager copies the chunk file information, for example, to storage media, such as disks, tapes, CD-ROMs or other media for storage. The data extracted from the chunk is stored, step 460. The data is generally stored to a storage device.

Figure 6:
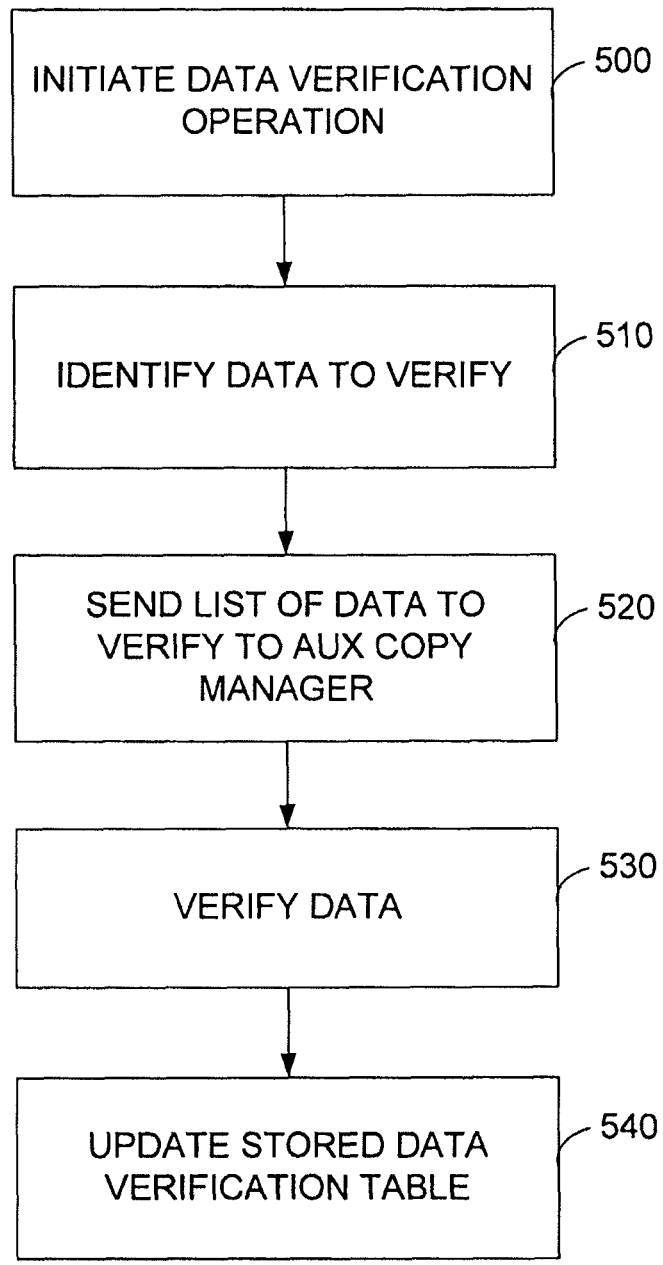
FIG. 6 is a flow diagram for verifying stored data, according to an embodiment of the invention.

Referring to FIG. 6, which depicts a flow chart for verifying stored data according to one possible embodiment of the invention, a data verification operation is initiated, step 500. The data verification operation may be scheduled by the job manager according to a storage policy, and the job manager directs the archive check manager to initiate a data verification operation. Alternatively, the data verification operation is initiated by the storage manager, media agent, or other component. The data verification operation, as described herein, determines and verifies whether a copy of data is an accurate copy of an original data set.

Data to be verified in the data verification operation is identified, step 510. The data to be verified is identified by, for example, referencing a stored data verification table, such as the stored data verification table 600 depicted in FIG. 7. Alternatively, the data to be verified is identified according to information contained in an index, such as an SM index, an MA index, storage policy, or other component, or as directed by a user. The archive check manager identifies the data to be verified by referring to the stored data verification table 600, the index, such as the SM index or MA index, or other data source. Alternatively, the storage manager, job manager, media agent, copy manager or other system component identifies the data to be verified. The stored data verification table 600 data may be stored, for example to the SM index or MA index.

Referring to FIG. 7, the data verification table 600 includes data such as the data shown in a column titled chunk ID 610, a column titled chunk verified 620, a column titled result 630, or other information. Chunk ID 610 is an alphanumeric identifier for the file, block, chunk or data set stored, such as the files, blocks, chunks, or data sets stored to chunk payload. Chunk verified 620 provides a yes or no flag indicating whether the chunk or data has been verified, for example, in a data verification operation, as described herein. Result 630 indicates the result of the data verification operation, such as good copy, unsuccessful, bad file, bad incremental block, or other result. In addition to verifying whether the data is accurate, the data verification operation identifies with particularity which part of the file or copied data is not a good copy, such as the result in column result 630 which indicates that file 5 is bad.

Referring again to FIG. 6, as mentioned herein, in general, the job manager schedules data verification operations and other storage operations, and directs the archive check manager to identify data to be verified. The archive check manager may refer to an index, such as an MA index, to identify data to be verified. Alternatively, the archive check manager may identify the data to be verified in step 510 by referring to the stored data verification table. The archive check manager may refer to the stored data verification table by chunk identifier to determine whether the chunk has been verified, for example, according to the data contained in a chunk verified column. Alternatively, the archive check manager refers to the stored data verification table by data contained in the chunk verified column to determine which chunks have not been verified, and obtaining the chunk identifier for unverified chunks.

The archive check manager obtains the list of data for verifying, as described herein, and sends it to the copy manager, or other system component, step 520. The list of data for verifying can be sent, for example as data stored to an index, such as an SM index or MA index, or in a communication to the copy manager. Generally, upon receipt of the list of data to be verified, the copy manager verifies the data, step 530.

Figure 8:
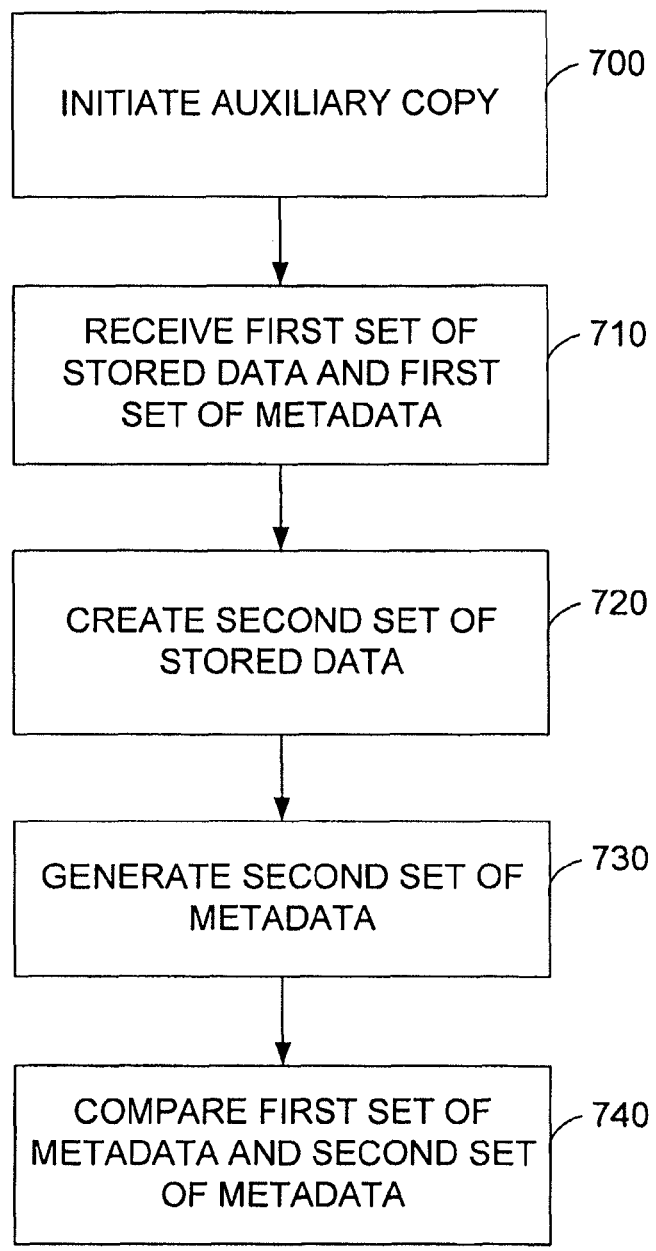
FIG. 8 is a detailed flow diagram of a step of the flow diagram of FIG. 6 for verifying stored data, according to an embodiment of the invention.

An embodiment of step 530 is depicted in the detailed flowchart of FIG. 8. The copy manager, or other system component, initiates a copy operation, step 700. The copy manager receives a first set of stored data, such as production data, or alternatively, a primary copy, or other original copy of data, and a first set of metadata, step 710. The first set of stored data is typically stored to a storage device and information associated with the first set of stored data, such as the first set of metadata, is stored to an index, or other system component. The index, or other system component, provides the source of the first set of stored data and the first set of metadata received by the copy manager. In another embodiment, the copy manager, or other system component, generates the first set of metadata, as described herein, for the first set of stored data. In general, the copy manager may perform a copy read operation, wherein, the first set of stored data is read, and a set of metadata is generated. The first set of metadata may be stored to an index, or other system component.

The copy manager, or other system component, may generate a second set of metadata, step 720. The copy manager may read a copy of the first set of stored data, such as an secondary storage copy, e.g., a backup or auxiliary copy, or other copy and performs a partial storage operation. The partial storage operation is generally a copy operation, such as a copy operation used to create a copy of the first set of stored data, auxiliary copy or other copy. The partial storage operation includes reading the data file, creating metadata associated with the data file, but does not complete the copy operation. Thus, only metadata is generated in the partial storage operation. The procedure for generating the metadata in the partial storage operation may be the same as the procedure used to generate the first set of metadata (for example, FIG. 2, step 260), and the first and second sets of metadata may be chunk headers, such as chunk header 300. A copy of the second set of metadata can be stored for later reference to an index, or used immediately in a comparison of the first set of metadata and second set of metadata, step 730.

Referring back to FIG. 6, the result of the data comparison, for example, the comparison of the first set of metadata is updated to the stored data verification table, step 540. If the first and second sets of metadata are the same, the copy manager updates the stored data verification table to reflect the result to indicate the second set of stored data is a good copy. Alternatively, if the first and second sets of metadata are different, the copy manager can determine which of the files, for example, which of the files in the chunk, are inconsistent, and update the results data accordingly, for example, the data included in the column results 630 of FIG. 7, such as file 5 is bad, bad incremental block, the verification was unsuccessful, or other result. When the data verification result is something other than good copy, the copy manager may initiate another copy or backup operation to copy or back up the first set of stored data.

After a copy is verified as described herein, the copy may be archived, or stored in secondary storage, such as in a storage library, at an offsite location or other storage location. The copy is generally written on media, such as tapes, or on disks, optical media, magnetic storage, such as hard drives, or other media and stored. Such media can eventually fail, which may cause data loss. For example, tapes can be damaged, lost, become corrupted, or optical media can be scratched or damaged and the data on the tape or media may not be retrieved. Thus, copies of data on the media must be verified on an ongoing basis to maintain a reliable archive of data.

In general, a media item may have a known life expectancy. For example, a media manufacturer may specify a shelf life for a type or piece of media. However, characteristics of media, media use, and other external factors, such as temperature, disaster, environmental conditions, or other factor, may have an effect on the life span and cause the media to fail sooner or last longer than expected. For example, a media item that is used to perform hourly storage operations, or that is stored in a particular storage library may have a shorter life span than a media item that is used to perform weekly storage operations and that is stored in another storage library. Information relating to copies and media, such as life expectancy, time relating to media use, verification algorithms used in connection with media, storage devices using the media, data usage, storage operations, storage policies, data types, bytes written to the media, data applications, media type, verification policy, media brand, or other information or criteria may be stored to an index in association with the media item.

Figure 9:
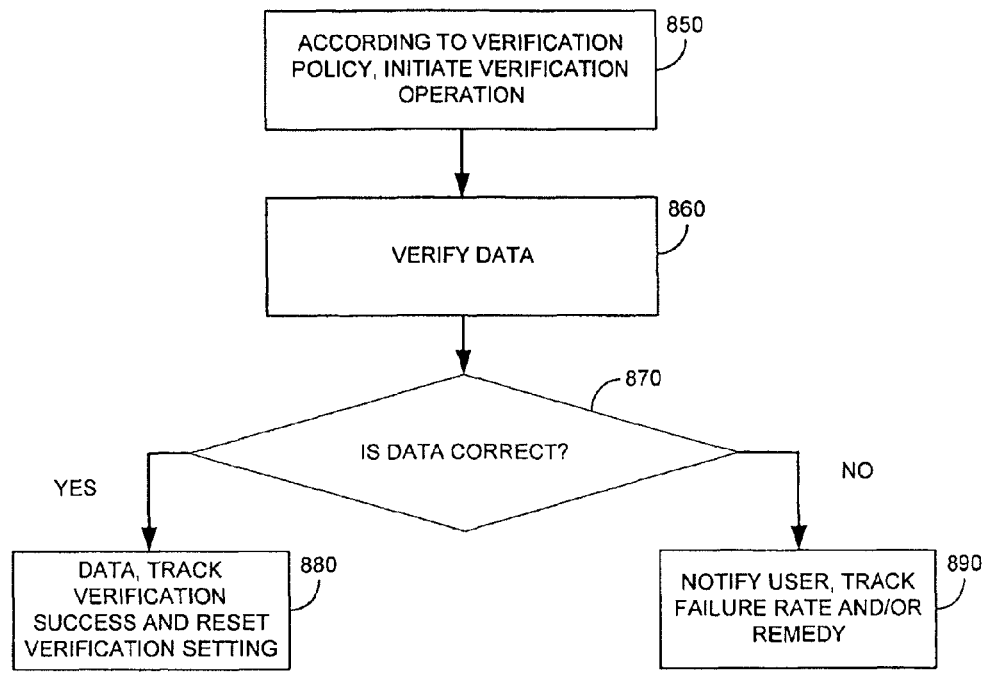
FIG. 9 is a flow diagram of a method for reverifying data, according to an embodiment of the invention.

Referring to FIG. 9, a method is presented for reverifying a media item. A media item that has been verified may be verified on an ongoing basis, for example, in accordance with a verification policy. Such repetitive verification may be referred to as reverification. Each media item may have an associated verification policy, which is generally a set of preferences and procedures associated with media verification and reverification, and may include an indicator of a time at which to verify or reverify a copy or media and a data verification method. The verification policy time may specify a time period that is somewhat shorter than the expected life span of the copy or media. The verification policy may be set in accordance with a user preference, or set automatically in accordance with media information, a storage policy or other information. In accordance with the verification policy, a verification operation is initiated, step 850. In general, a storage manager or media agent may consult a table or index for a verification policy for a media item. Based on the verification policy, the verification operation is initiated by the storage manager or media agent directly or in communication with a job manager. In general, a verification policy may be used to generate a data structure such as a verification table.

One example of such table or index is the Verification Table 900 depicted in FIG. 10. As shown, items 925-937 have a respective ID 920, verification policy 940, last verification date 950, number of times the item has been verified 955, reverification status 960, Criteria 970, Verification Operation Result 980, expected failure 990, or other information. As shown, media item 925 has a verification policy that indicates that it should be reverified every two years. Since media item 925 was last verified on Nov. 16, 2003, it is overdue for verification. Media may be overdue for verification if, for example, the media is stored offsite and is being returned to the storage device for reverification, or if the media cannot be located, or other reason. Media item 930 has a verification policy of six months and was last verified on Jun. 30, 2005 and is due for verification in eleven days. Thus, on or before Dec. 30, 2005, a media agent or storage manager will initiate a verification operation in accordance with the verification policy, by directing an archive check manager, job manager, copy manager or other component to commence a verification operation.

In some cases, a media agent or storage manager may initiate a verification operation earlier than the verification policy may specify if, based on predictive logic, further described herein, there is an indication that a media item may fail earlier than its expected lifespan. For example, for a media item 935 which has a verification policy for one year, but it has a history or criteria of being used for daily copies 970, or other heavy usage, and in the past has failed a verification operation 980, it may be expected to fail 990 at a time period earlier than the verification policy. In such a case, a verification operation may be initiated earlier than the verification policy period.

In other cases, a media item, such as media item 935 may have new verification status and may have never been verified in the past (to the extent that the history of the media item is known to the system). In such case, the media item may be flagged to be immediately verified, or set to be verified according to the verification policy, because, for example, the media item is new and assumed to have an accurate copy of data.

Referring again to FIG. 9, the media may be verified, step 860. The media may be verified according to known verification methods (e.g., a full verification which may compare a secondary copy data file with a primary copy), or in accordance with data verification operations described herein, e.g., the data verification procedure described with reference to FIGS. 2-3, 6 and 8. Based on the verification operation, a media agent may determine whether the data is correct, for example, that the verification operation was a success, step 870. In general, the verification operation will succeed, fail, or partially succeed or fail. For example, as described herein, an entire media item may succeed or fail a verification operation, or portions of media or data files may fail the verification operation. A verification operation may also fail in light of a mechanical failure, such as a library failure or library component failure, or the media item may be unavailable to perform the verification procedure, and thus fails the verification operation. In the event of mechanical failure, or other data verification operation failure, a storage manager or media agent may retry the verification operation.

If the data is successfully verified (e.g., accessible, and determined to be correct or accurate, etc.,) information about the verification operation success, criteria, test results, time period to expected failure, or other information, such as information regarding characteristics of the media may be stored. In addition, the data may be copied again to new media and the verification date may be reset, step 880. For example, the date 950 in Verification Table 900 of FIG. 9 may be set to the date the verification operation is performed and the verification policy time begins to run from the new date.

Information relating to the verification operation and characteristics of the media may be stored in a table or index and include, generally, such criteria as: media type, expected life of media, storage operation transactions, such as a number of or type of storage operation performed on an item of media, bytes of data written to the media, bytes used per storage operation, number of reads and writes, use in restore operations, library location(s), media brand, data applications stored to media, a particular user, cell, department, or organization that used the media, or other media characteristic. In general, such criteria can be used to track quantifiable or tangible characteristics and events associated with a particular media item. The criteria can be used to generate a metric or other indication relating to verification expectancies of media, or other system components, and expected success rates for storage operations, such as a verification operation.

If the media or data verified is determined to fail the verification operation, a user may be notified, the failure rate tracked, and/or the system may attempt to remedy the failure, step 890. If the media fails the verification operation, a user may be notified that data may be lost. Such a notification may be optional or sent in accordance with a user preference or storage policy. For example, a user may set a preference that all verification failures relating to data from a certain time period or application type should trigger an alert or notification to the user. In general, the media failure will also cause a media agent or storage manager to track information about the verification failure, including media characteristics, such as: media type, expected life of media, storage operation transactions, bytes of data written to the media, bytes used per storage operation, reads and writes, use in restore operations, library location(s), media brand, data applications stored to media, a particular user, cell, department, or organization that used the media, or other media characteristic. For example, for a particular media type may be associated with a higher rate of data verification success than another media type, a particular media life expectancy may be more accurate or predictable for media having certain criteria, heavy media use in storage operations may cause media to fail earlier than a media item used in fewer storage operations, certain storage libraries may be associated with higher media failure rates, for example, in a storage library which may have defective media slots, or other criteria may cause an effect on media life expectancy and verification operation failure rates. In general, such criteria tracking may be done automatically and may cause a change to a verification policy, which may or may not be communicated to a user.

Figure 11:
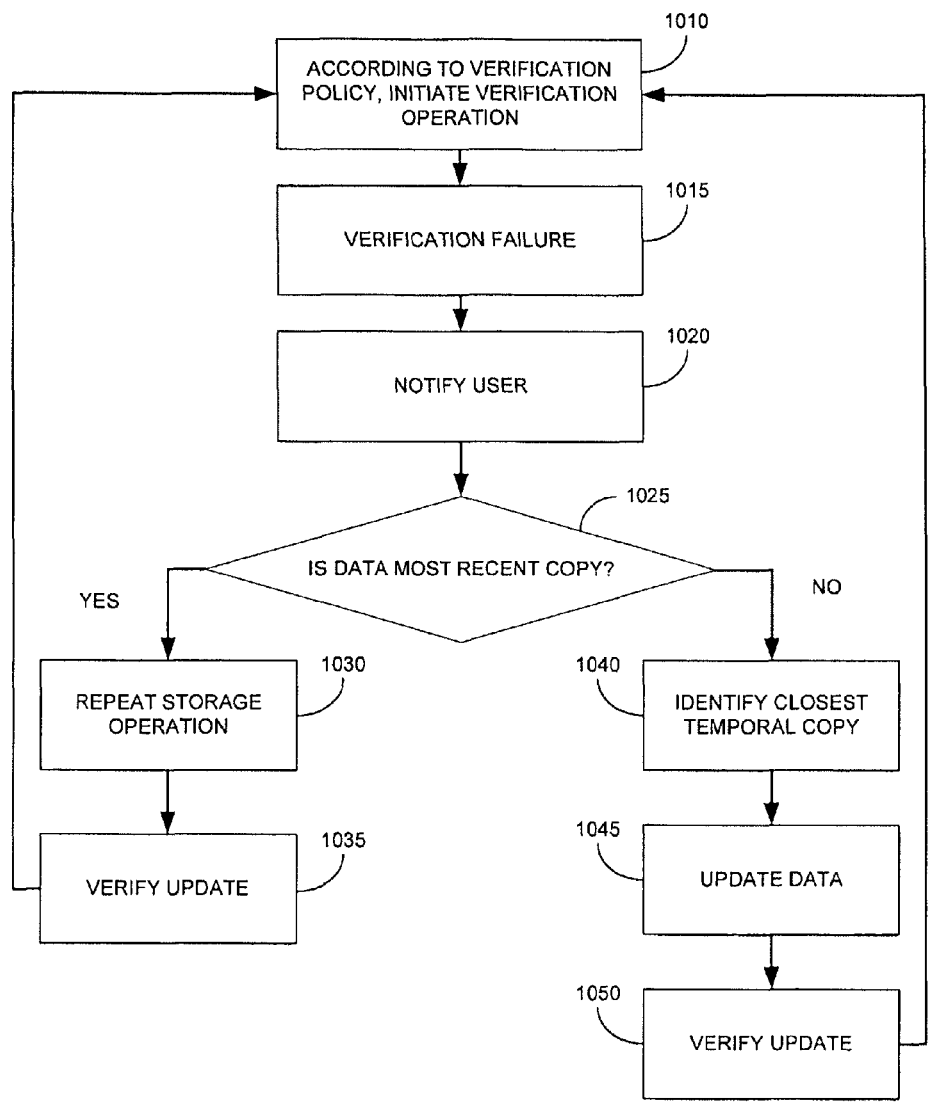
FIG. 11 is a flow diagram of a method for remedying a failed verification operation, according to an embodiment of the invention.

Remedying the failed media may include a media repair procedure, or the method described in reference to FIG. 11. Turning to FIG. 11, which describes a method for performing verification operations and repairing a data copy or media item that fails a verification operation, a verification operation may be initiated according to a verification policy, step 1010. For example, this step may be performed as described in reference to step 850 of FIG. 9. For example, a media agent or storage manager may initiate a verification operation by identifying a media item having a verification policy which indicates that its verification period is due, and direct a media agent, archive check manager, job manager, copy manager or other component to commence a verification operation. Unfortunately, the verification operation fails, step 1015. The verification operation failure may be due to a number of reasons, including, for example, an unavailable media item, e.g., a lost media item, corrupted data, damaged media, mechanical failure, media failure, storage library failure, or other reason. In such situations, a storage manager or media agent may determine a reason for the verification failure. In the event that the verification failure may have been caused non-media related reasons, such as a mechanical failure, the storage manager or media agent may reschedule a verification operation when a system component check determines that the non-media related problem has been repaired.

A user, system administrator or other individual may be notified of the verification operation failure, step 1020. This step is optional, and may be in accordance with a user preference or default setting for alerts and notifications. A media agent or storage manager may consult an index to determine characteristics of the media or data copy including whether the copy or media reflects a most recent copy of data, step 1025. For example, if a copy failing a verification operation was just copied in a storage operation and the copy is being verified in connection with the storage operation, the media agent may direct the storage operation to be repeated, step 1030. The new copy created in the repeated storage operation may be verified, for example, according to a verification procedure described herein or other verification procedure, and information relating to the storage operation and verification operation is updated in a table, step 1035.

In the event that a data copy failing a verification operation is not the most recent copy, e.g., in accordance with scheduled verification, or other schedule, a media agent or storage manager may identify a close temporal copy, step 1040. For example, a data copy from a similar time period or user may be used as a substitute for the failed data. Such a substitute may be identified by consulting an index and identifying a copy in near proximity to the failed copy, such as a copy verified before or after the failed copy. For example, if a copy of database data from Nov. 15, 2001, has a two year verification policy term and it has been copied and verified previously twice (once in an initial copy on Nov. 15, 2001, and the second time at two years on Nov. 15, 2003), and on Nov. 15, 2005, the database data copy fails a verification procedure, then a storage manager or media agent may consult its index to identify a copy of data that may have an index entry immediately before or after the index entry for the failed copy, e.g., an index entry for a copy created immediate before or after the failed copy. Other characteristics than time, may also be used to identify a similar copy to replace the failed copy, such as application type, client, user, or other characteristic.

Characteristics of substitute copies, such as acceptable time periods, or other characteristics may vary based on an application type, use, user, client, or other characteristic. For example, certain applications or users may create data that is frequently changed and substituting close copies may not be useful. In one example, email or financial trading data may change more frequently than word documents or database files. In this case, a user preference may be set to specify that close temporal copies may be used to the extent that the data is within a two hour time period from the failed media item. Data that is more than two hours from the failed media item may be considered too different to be useful. A user may also set a user preference that in the event that a close temporal copy cannot be found, an alert should be sent to the user. Such preferences or other acceptable characteristics of substitute copies may be set forth in a verification policy or other storage preference.

If a close temporal copy of data can be identified, a copy of the close temporal data is created and substituted to update a new copy for the failed media, step 1045. In general the copy may be a storage operation described herein, such as an aux copy or other copy. The updated copy is verified, according to a verification operation, step 1050, such as a verification operation described herein or other verification operation. Information about the verification failure and media characteristics may be stored to track verification and media metrics, as further described herein.

Tracking verification operations for media across an enterprise is useful to determine life expectancy of media and media use. Since media can be costly, companies, enterprises or other high volume media users may seek to reduce media consumption. For example, although media needs can be generally forecast when use of media is constant, changes in media use or other characteristics may cause fluctuations in media needs, life spans, use, etc. Such information can be tracked automatically and a storage manager or other component can dynamically assign a verification policy to a media item that takes into consideration media characteristics that may shorten or lengthen a media life expectancy, and correspondingly, a verification time period.

Figure 12:
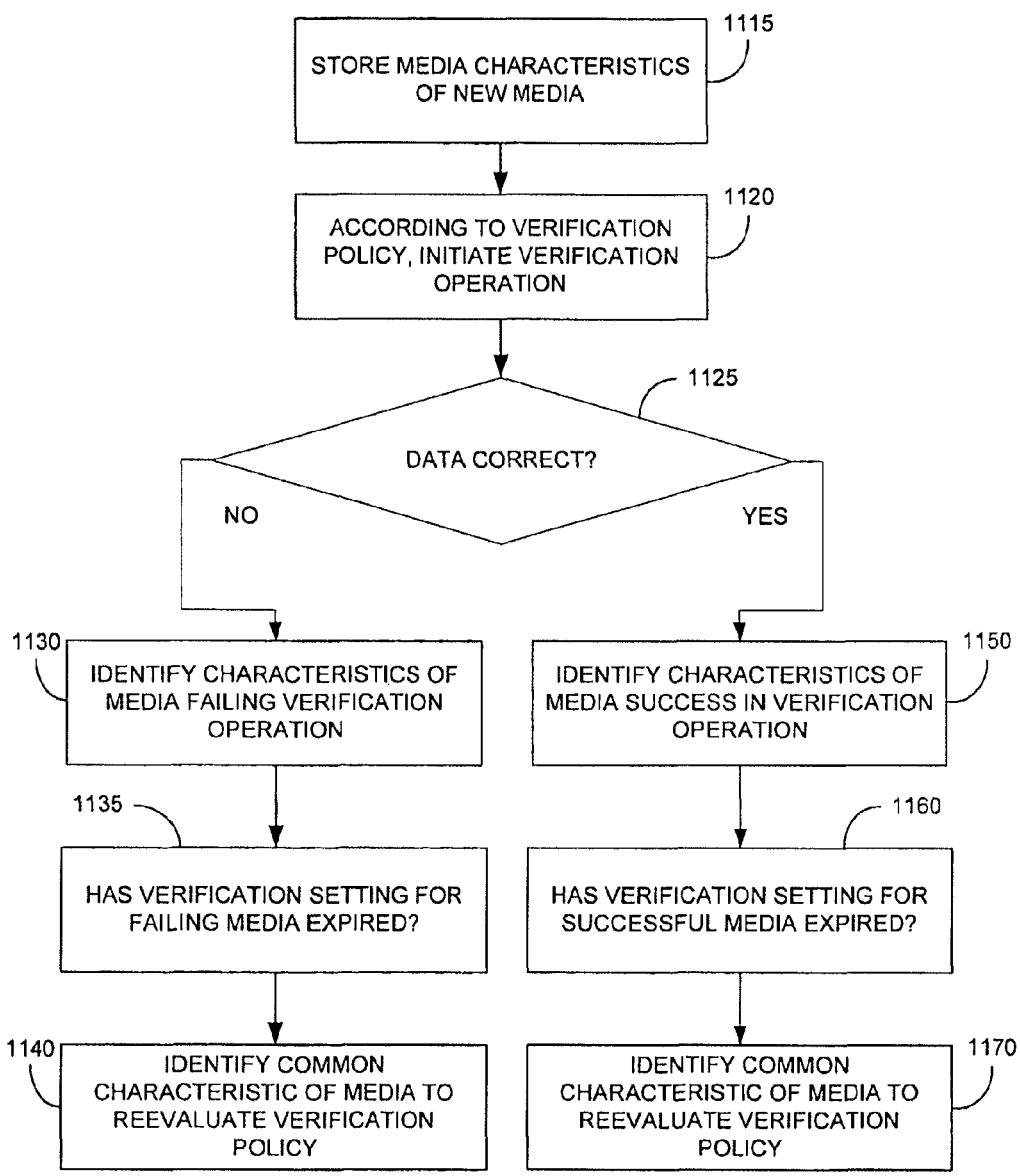
FIG. 12 is a flow diagram of a method for tracking global media verification, according to an embodiment of the invention.

Thus, the system may track media consumption according to the flow diagram of FIG. 12. Characteristics of new media items may be stored to a table or index, for example, when the media item is added to a storage device or otherwise added to a storage system, step 1115. Characteristics of the new media that may be stored include, for example: media type, expected life of media, number and types of expected storage operation transactions, expected bytes of data written to the media, expected bytes used per storage operation, number of expected reads and writes, expected use in restore operations, expected library location(s), media brand, expected data applications stored to media, expected user, cell, department, organization that used the media, or other media characteristic. Such information may be obtained from user input, template, database of information relating to media and storage devices, according to a storage policy that may be associated with the new media item, or other source. The characteristics of the new media item may be updated as the media is used.

One example of a table of media characteristics may be the Media Verification Failure/Success table depicted in FIG. 13. Characteristics 1320 of media items 1330-1333 may be tracked, such as storage device location, frequency of storage operations, the users or departments generating data, or other media characteristic. The Media Verification Failure Success Table 1300 may also include a verification policy 1310 of a media item, outcome 1315 of verification operations or other information relating to tracking media verification. The verification table may provide useful data for calculating metrics relating to media verification rates. For example, characteristics 1320 include for example, a storage device or storage library identifier, frequency of copy operations, application types, and may include other characteristics which may affect the life span of a media item.

Turning again to FIG. 12, a verification operation may be initiated according to a verification policy, step 1120. The verification operation may be a verification operation previously described herein that is initiated by system components as described herein. A media agent or storage manager may determine whether the data verified is correct or that a verification operation failed or succeeded, step 1125. In the event that the data verified is not correct, and that the verification operation failed, a media agent (or storage manager) identifies characteristics of the media, step 1130. Such characteristics may be obtained from a table or index, such as a table 1300 depicted in FIG. 13.

The media agent (or storage manager) may also consult the table or index to determine whether a verification policy time period has expired, step 1135. For example, if a media item failed a verification operation before its verification policy time period expired, then the media item did not last through its expected life span. In this case, a storage manager (or media agent) may identify characteristics of the media item to determine if there are any commonalities with other media that may fail before its expected life span and reevaluate the verification policy for the media, step 1140. For example, a media agent (or storage manager) may determine that a particular storage device, storage library, or other component is causing media to fail before a verification policy time period, or that a group of media having a certain number of storage operation transactions which exceeds a threshold may fail prior to a verification policy time period, or other characteristic.

If the verification time period had expired, then the media item may have lasted through its expected life span. Thus, a media agent (or storage manager) may track characteristics of the media to determine any characteristics that may be common with other media that may have failed at or around its respective verification policy time period. Metrics about media use and corresponding effects on life span may be obtained and the verification policy for a media item may be reevaluated, step 1140. For example, for media items that consistently live to an expected life expectancy, a common characteristic may be identified, such as a number of storage transactions below a certain threshold, or use in a particular storage component, or other characteristic. Media items have such characteristics may have its respective verification policy time period somewhat lengthened or maintained, to optimize efficient use of media.

In the event that data is successfully verified at step 1125, characteristics of media succeeding in verification operations may be identified, step 1150. Characteristics of media identified for successful verification operations may be similar to the characteristics tracked for media that fails verification operations, e.g., at step 1130, or other characteristics. These characteristics may be obtained in a table or index, such as the table 1300 in FIG. 13. A media agent (or storage manager) may determine whether the verification policy for the media succeeding in a verification operation has expired or not, step 1160. The verification policy may be obtained by consulting a table or index. If a verification policy time period has expired, yet the media is successfully verified, a media agent (or storage manager) may identify characteristics of the media which may cause it to outlive its expected life span. If the verification policy time period has not expired, and the media is successfully verified, then the media has generally survived to its expected life span. A media agent may identify characteristics of the media and confirm that such characteristics are indicative of a media item may lead to a particular life span. For example, a media agent (or storage manager) may identify a common storage device or other component associated or used with media which may live to or outlive its expected life expectancy, or a number of storage transactions for media which may live to or outlive its expected life expectancy or other characteristic. Thus, a media agent may determine that the verification policy time period is too short and evaluate, by considering global media health under such characteristics, extending the verification policy time period. The media characteristics may also be tracked, step 1170 to determine metrics for comparative media use and life span.

As described herein, the media agent, or storage manager, or other system component may track characteristics of a media item, during the life of the media, and track information such as the current storage device used, storage operations performed, data application types, or other current media characteristics. For example, the media characteristics may be used in a metric to continuously and dynamically evaluate verification operations and verification policies to extend life and usage of media items. In addition, media characteristics may be used as a basis for generating reports on media consumption or use. For example, the media agent may identify average media failure rates and failure rates according to users, departments, transaction frequency, time, media type, hardware device, or other characteristic, criteria, indicia or factors.

Figure 14:
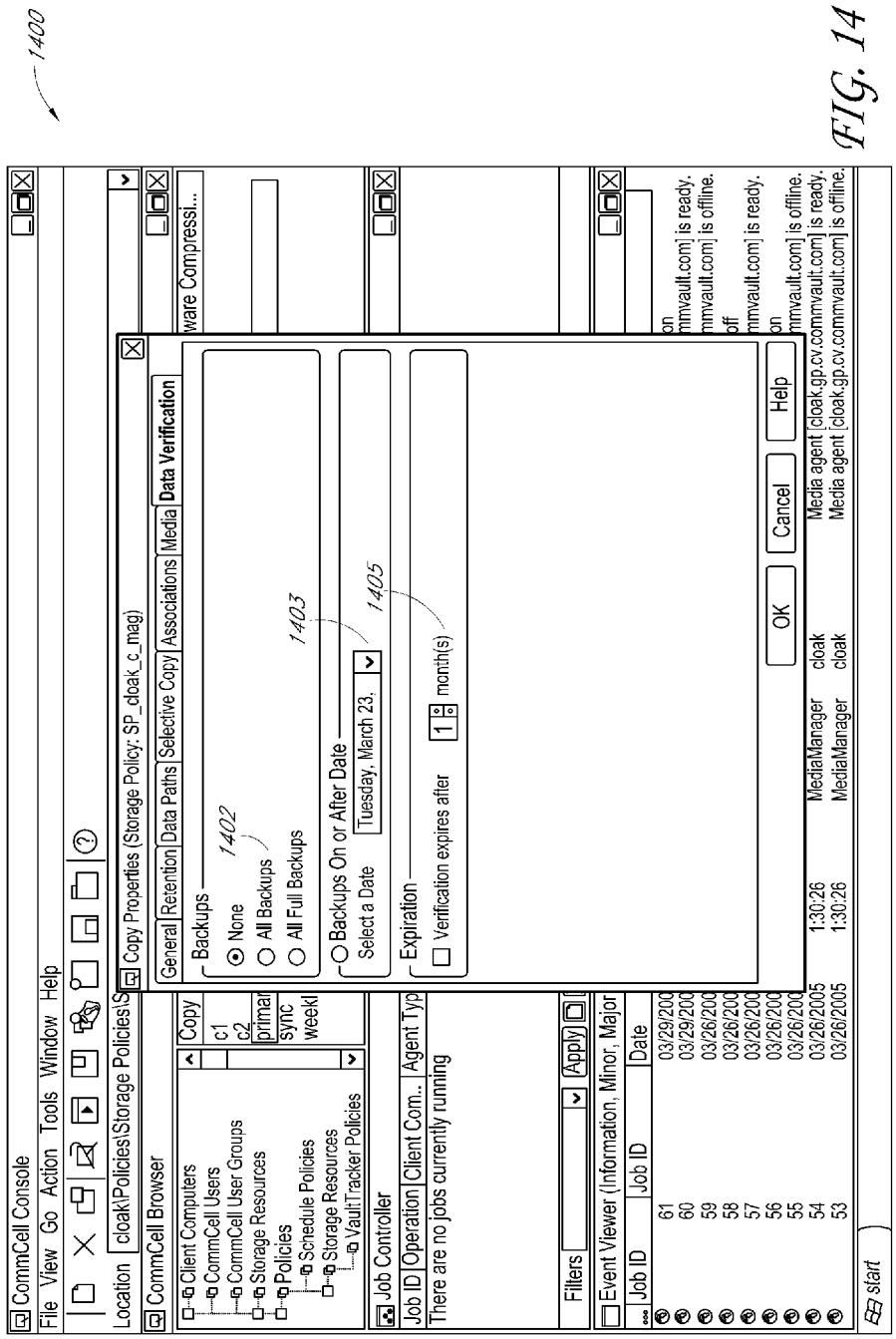
FIG. 14 is a screenshot of a graphical user interface for setting a verification policy, according to an embodiment of the invention.
Figure 15:
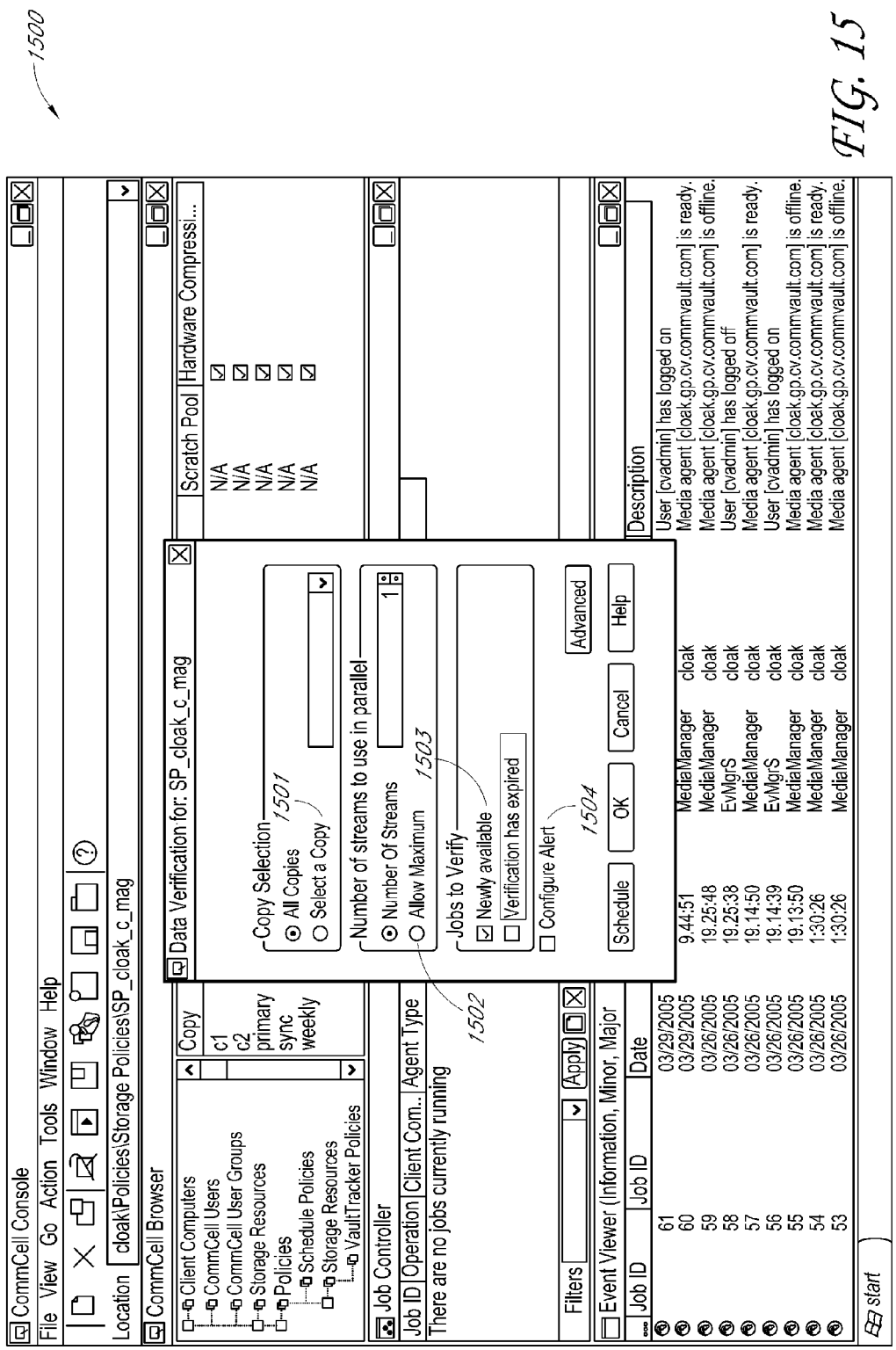
FIG. 15 is a screenshot of a graphical user interface for initiating a verification operation, according to an embodiment of the invention.

In general, when a new media item is added to a storage device and periodically verified over the life span of the media item, a verification policy may be dynamically assigned to the media item which takes into consideration characteristics of past media items, the anticipated use of the new media item, such as according to its storage policy, and past use of the media item, if any. Alternatively, when a new media item is added, or at any time in the life of a media item, a user may set a user defined verification policy. FIG. 14 depicts an exemplary graphical user interface for setting a verification policy for a media item according to an embodiment of the invention. As shown a user may select a verification expiration or verification time period 1405 which applies to backups of a certain date 1403 or all, none or some backups 1402. FIG. 15 depicts an exemplary graphical user interface according to an embodiment of the invention for setting a verification policy for a media item which selects a copy 1501, streams to use 1502, such as streams to use in a verification operation, jobs to verify 1503, such as new media or media having expired verification periods, and alerts 1504, such as user alerts in the event of a verification operation failure.

Systems and methods disclosed herein are used generally to check or verify all data in a storage system. In some embodiment, the systems and methods can be applied selectively to portions of data, such as granular verification in terms of sets of data. For example, in some embodiments, data within the system can be arbitrarily grouped into secondary storage groups, or portions of data, e.g., into backup sets wherein data in one backup set can also be in another backup set, such that it is not exclusively in one backup set. At the sub-client level, data in one sub-client group is not in another sub-client group and is exclusive to a sub-client. As described herein, backup sets may have several sub-clients in a set, at the application level, or as specified in a storage policy for a group of data.

While the invention has been described and illustrated in connection with preferred embodiments, many variations and modifications as will be evident to those skilled in this art may be made without departing from the spirit and scope of the invention, and the invention is thus not to be limited to the precise details of methodology or construction set forth above as such variations and modification are intended to be included within the scope of the invention.

What is claimed is:

1. A system for verifying data in a data storage environment, the system comprising:
    a volume of data comprising a group of files, wherein the volume of data is stored in first storage media; and
    a storage manager comprising computer hardware, the storage manager configured to:
    generate a copy of the volume of data and store the copy in at least second storage media;
    generate a first set of metadata associated with the volume of data stored in the first storage device and store the first set of metadata in a first index, the first index accessible by the storage manager;
    generate a second set of metadata associated with the copy and store the second set of metadata in a second index stored separately from the volume of data the second index stored accessible by the storage manager;

perform, based on a predetermined verification policy time period, a copy verification that the copy of the volume of data on the second storage media is an accurate copy of the volume of data on the first storage media by comparing the first set of metadata stored separately from the volume of data and the second set of metadata stored separately from the volume of data;

verifying the second storage media based at least in part on information associated with the copy verification; and on determining that a life span of the second storage media outlives an associated life expectancy, identifying characteristics of the second storage media that are indicative of the predetermined verification policy time period being too short;

modifying a future verification time period for at least third storage media that shares the identifying characteristics of the second storage media to extend the usage of the third storage media.

2. The system of claim 1, wherein the storage manager is further configured to determine a verification schedule that indicates the future verification time period, wherein the storage manager is configured to compare the first and second sets of metadata according to the verification schedule.

3. The system of claim 2, wherein the verification schedule is based at least partially on a data type of the copy.

4. The system of claim 1, wherein the storage manager is configured to repair the copy of the volume of data on determining that the first and second sets of metadata are not substantially equivalent.

5. The system of claim 1, wherein the storage manager is further configured to update a verification table to indicate whether the first and second sets of metadata are substantially equivalent.

6. The system of claim 1, wherein the storage manager is further configured to access a usage history of the second storage media, wherein the usage history comprises at least a number of storage operations performed on the second storage media.

7. The system of claim 6 wherein the usage history comprises an average amount of data per storage operation written on the second storage media.

8. The system of claim 1, wherein on determining that the first and second sets of metadata are not substantially equivalent, the storage manager is further configured to:
 identify at least one storage characteristic of the second storage media;
 identify at least one other storage media sharing the at least one storage characteristic; and
 store the copy of the volume data in the other storage media.

9. A method for verifying copied data, the method comprising:
 generating with a storage manager comprising computer hardware, a copy of a volume of data stored in a at least first storage media;
 storing the copy in at least a second storage media;
 generating a first set of metadata associated with the volume of data stored in the first storage media;
 storing the first set of metadata in a first index, the first index accessible by the storage manager;
 generating a second set of metadata associated with the copy;
 storing the second set of metadata in a second index, the second index stored accessible by the storage manager;
 with storage manager, performing, based on a predetermined verification policy time period, a copy verification that the copy of the volume of data on the second storage media is an accurate copy of the volume of data on the first storage media by comparing the first set of metadata and the second set of metadata;
 verifying the second storage media based at least in part on information associated with the copy verification;
 on determining that a life span of the second storage media outlives an associated life expectancy, identifying characteristics of the second storage media that are indicative of the predetermined verification policy time period being too short; and
 modifying a future verification time period for at least third storage media that shares the identifying characteristics of the second storage media to extend the usage of the third storage media.

10. The method of claim 9, further comprising determining a verification schedule, wherein the comparing the first and second sets of metadata is performed according to the verification schedule.

11. The method of claim 10, wherein the verification schedule is based at least partially on a data type of the copy.

12. The method of claim 9, further comprising repairing the copy of the volume of data on determining that the first and second sets of metadata are not substantially equivalent.

13. The method of claim 9, further comprising updating a verification table to indicate whether the first and second sets of metadata are substantially equivalent.

14. The method of claim 9, further comprising accessing a usage history of the second storage media, wherein the usage history comprises at least a number of storage operations performed on the second storage media.

15. The method of claim 14, wherein the usage history comprises an average amount of data per storage operation written on the second storage media.

16. The method of claim 9, wherein on determining that the first and second sets of metadata are not substantially equivalent, the method further comprises:
 identifying at least one storage characteristic of the second data storage device;
 identifying at least one other storage media sharing the at least one storage characteristic; and
 storing the copy of the volume data in the other storage media.

* * * * *